US012603638B2

(12) United States Patent

Kimura et al.

(10) Patent No.: US 12,603,638 B2

(45) Date of Patent: Apr. 14, 2026

(54) ACOUSTIC WAVE DEVICE

(71) Applicant: Murata Manufacturing Co., Ltd., Nagaokakyo (JP)

(72) Inventors: Tetsuya Kimura, Nagaokakyo (JP); Takashi Yamane, Nagaokakyo (JP); Sho Nagatomo, Nagaokakyo (JP); Yuji Toyota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 989 days.

(21) Appl. No.: 17/701,981

(22) Filed: Mar. 23, 2022

(65) Prior Publication Data

US 2022/0216849 A1 Jul. 7, 2022

Related U.S. Application Data

(63) Continuation of application No. PCT/JP2020/036414, filed on Sep. 25, 2020.

(30) Foreign Application Priority Data

Sep. 27, 2019 (JP) ................................. 2019-177324

(51) Int. Cl.

| | |
|---|---|
| *H03H 9/13* | (2006.01) |
| *H03H 9/02* | (2006.01) |
| *H03H 9/17* | (2006.01) |

(52) U.S. Cl.

CPC ........ *H03H 9/132* (2013.01); *H03H 9/02031* (2013.01); *H03H 9/02228* (2013.01); (Continued)

(58) Field of Classification Search

CPC .............. H03H 9/132; H03H 9/02031; H03H 9/02228; H03H 9/174; H03H 9/175; H03H 9/176

See application file for complete search history.

(56) References Cited

U.S. PATENT DOCUMENTS

| | | |
|---|---|---|
| 2008/0179989 A1 | 7/2008 | Ogami et al. |
| 2010/0223999 A1* | 9/2010 | Onoe ................. H03H 9/02622 73/579 |

(Continued)

FOREIGN PATENT DOCUMENTS

| | | |
|---|---|---|
| CN | 107112975 A | 8/2017 |
| JP | H07240657 A | 9/1995 |

(Continued)

OTHER PUBLICATIONS

English Translation of JPH09298441 (Year: 1997).*

(Continued)

*Primary Examiner* — Bryan P Gordon

(74) *Attorney, Agent, or Firm* — Keating & Bennett, LLP

(57) ABSTRACT

An acoustic wave device includes a piezoelectric layer made of lithium niobate or lithium tantalate, and at least one pair of electrodes opposed to each other in a direction intersecting a thickness direction of the piezoelectric layer. When d is a thickness of the piezoelectric layer and p is a distance between centers of electrodes adjacent to each other in the at least one pair of electrodes, d/p is about 0.5 or less. The at least one pair of electrodes extend in a longitudinal direction and includes a first electrode and a second electrode with sectional shapes different from each other in any cross section in a direction orthogonal or substantially orthogonal to the longitudinal direction of the at least one pair of electrodes.

18 Claims, 18 Drawing Sheets

(52) U.S. Cl.
CPC ............ *H03H 9/174* (2013.01); *H03H 9/175*
(2013.01); *H03H 9/176* (2013.01)

(56) References Cited

U.S. PATENT DOCUMENTS

| | | | |
|---|---|---|---|
| 2013/0057360 A1 | 3/2013 | Meltaus et al. | |
| 2014/0152145 A1 | 6/2014 | Kando et al. | |
| 2014/0152146 A1 | 6/2014 | Kimura et al. | |
| 2017/0201229 A1 | 7/2017 | Tanaka | |
| 2017/0222619 A1* | 8/2017 | Iwamoto | H03H 9/14541 |
| 2018/0159494 A1 | 6/2018 | Goto et al. | |
| 2019/0245510 A1* | 8/2019 | Mimura | H10N 30/06 |
| 2020/0083863 A1* | 3/2020 | Makkonen | H03H 9/547 |
| 2020/0220518 A1* | 7/2020 | Omura | H03H 9/132 |
| 2020/0295730 A1 | 9/2020 | Nagatomo et al. | |
| 2020/0336133 A1* | 10/2020 | Nakagawa | H04B 1/18 |

FOREIGN PATENT DOCUMENTS

| | | | |
|---|---|---|---|
| JP | H09266431 A | 10/1997 | |
| JP | 09-298441 A | 11/1997 | |
| JP | 2010-233210 A | 10/2010 | |
| JP | 2012-257019 A | 12/2012 | |
| JP | 2013-115496 A | 6/2013 | |
| JP | 2013-528996 A | 7/2013 | |
| JP | 2017126862 A | 7/2017 | |
| JP | 2018-074575 A | 5/2018 | |
| JP | 2019-075704 A | 5/2019 | |
| JP | 2019-140456 A | 8/2019 | |
| KR | 1020170068591 A | 6/2017 | |
| WO | 2007046236 A1 | 4/2007 | |
| WO | 2012073871 A1 | 6/2012 | |
| WO | 2019065666 A1 | 4/2019 | |
| WO | 2019111664 A1 | 6/2019 | |

OTHER PUBLICATIONS

Office Action in KR10-2022-7009805, mailed Mar. 21, 2024, 7 pages.

Official Communication issued in International Patent Application No. PCT/JP2020/036414, mailed on Dec. 15, 2020.

Official Communication issued in corresponding Chinese Patent Application No. 202080065605.2, mailed on Jan. 29, 2026, 10 pages.

* cited by examiner

ACOUSTIC WAVE DEVICE

CROSS REFERENCE TO RELATED APPLICATIONS

This application claims the benefit of priority to Japanese Patent Application No. 2019-177324 filed on Sep. 27, 2019 and is a Continuation application of PCT Application No. PCT/JP2020/036414 filed on Sep. 25, 2020. The entire contents of each application are hereby incorporated herein by reference.

BACKGROUND OF THE INVENTION

1. Field of the Invention

The present invention relates to an acoustic wave device that includes a piezoelectric layer made of $LiNbO_3$ or $LiTaO_3$.

2. Description of the Related Art

An acoustic wave device that uses plate waves propagating through a piezoelectric film made of $LiNbO_3$ or $LiTaO_3$ has been known. For example, Japanese Unexamined Patent Application Publication No. 2012-257019 discloses an acoustic wave device using Lamb waves defining and functioning as plate waves. In this acoustic wave device, an IDT electrode is provided on an upper surface of a piezoelectric film made of $LiNbO_3$ or $LiTaO_3$. A voltage is applied between a plurality of electrode fingers that are connected to one potential of the IDT electrode and a plurality of electrode fingers that are connected to the other potential. Thus, Lamb waves are excited. Reflectors are provided on both sides of the IDT electrode. An acoustic wave resonator using plate waves is thus configured.

To achieve a reduction in the size of the acoustic wave device described in Japanese Unexamined Patent Application Publication No. 2012-257019, a reduction in the number of electrode fingers can be considered. However, the reduction in the number of electrode fingers lowers a Q value. Moreover, a spurious response is sometimes generated on resonance characteristics.

SUMMARY OF THE INVENTION

Preferred embodiments of the present invention provide acoustic wave devices that each achieve an increase in a Q value even when a size reduction is achieved, and each enable a position or a magnitude of a spurious response to be controlled.

An acoustic wave device according to a preferred embodiment of the present invention includes a piezoelectric layer made of lithium niobate or lithium tantalate, and at least one pair of electrodes opposed to each other in a direction intersecting a thickness direction of the piezoelectric layer. Bulk waves in a thickness shear primary mode are used. The at least one pair of electrodes extend in a longitudinal direction. The at least one pair of electrodes include a first electrode and a second electrode with sectional shapes different from each other in any cross section in a direction orthogonal or substantially orthogonal to the longitudinal direction of the at least one pair of electrodes.

An acoustic wave device according to a preferred embodiment of the present invention includes a piezoelectric layer made of lithium niobate or lithium tantalate, and at least one pair of electrodes opposed to each other in a direction intersecting a thickness direction of the piezoelectric layer. When d is a thickness of the piezoelectric layer and p is a distance between centers of electrodes adjacent to each other in the at least one pair of electrodes, d/p is about 0.5 or less. The at least one pair of electrodes extend a longitudinal direction. The at least one pair of electrodes include a first electrode and a second electrode with sectional shapes different from each other in any cross section in a direction orthogonal or substantially orthogonal to the longitudinal direction of the at least one pair of electrodes.

In each of the acoustic wave devices according to preferred embodiments of the present invention, a Q value is increased even when size reduction is achieved, and a magnitude or a position of a spurious response is controlled.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing preferred embodiments of the present invention with reference to the accompanying drawings.

Each of the preferred embodiments described in the present specification is exemplary and a configuration can be partially replaced or combined with other configurations of different preferred embodiments.

A preferred embodiment of the present invention includes a piezoelectric layer made of lithium niobate or lithium tantalate and at least one pair of electrodes opposed to each other in a direction intersecting a thickness direction of the piezoelectric layer. At least one pair of electrodes extends in a longitudinal direction, and the at least one pair of electrodes includes a first electrode and a second electrode with sectional shapes different from each other in any cross section in a direction orthogonal or substantially orthogonal to the longitudinal direction of the at least one pair of electrodes. This allows control of the magnitude or position of a spurious response.

Bulk waves in a thickness shear primary mode are used in a preferred embodiment of the present invention. Moreover, in another preferred embodiment of the present invention, when d is the thickness of the piezoelectric layer and p is a distance between centers of electrodes adjacent to each other in at least one pair of electrodes, d/p is about 0.5 or less. This allows a Q value to be increased even when size reduction is achieved.

Figure 1A:
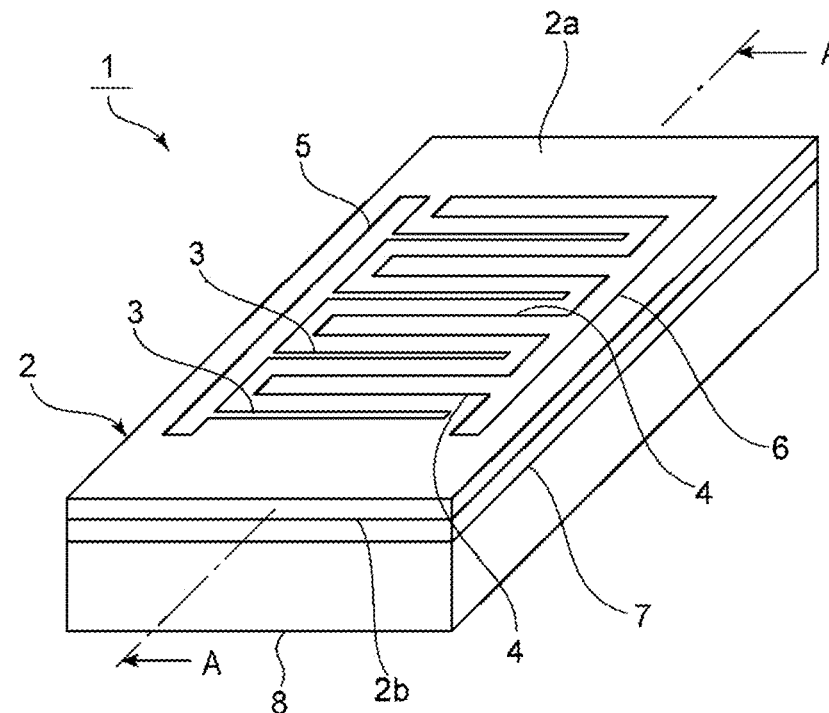
FIGS. 1A and 1B are respectively a schematic perspective view of an acoustic wave device according to a first preferred embodiment of the present invention and a plan view illustrating an electrode structure on a piezoelectric layer thereof.
Figure 1B:
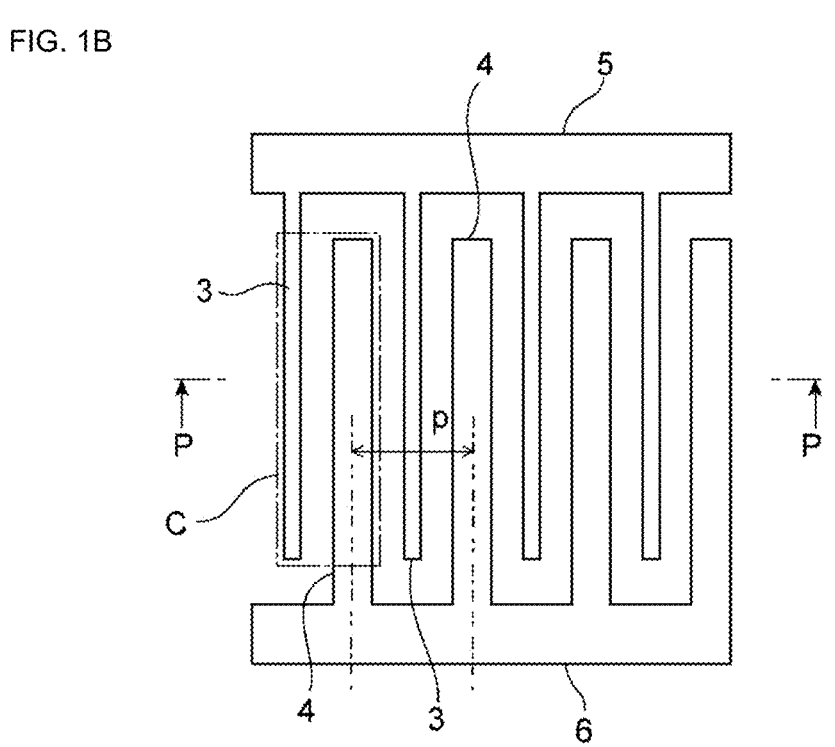
Figure 2:
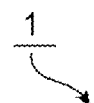
FIG. 2 is a sectional view of a portion taken along line A-A in FIG. 1A.
Figure 2:
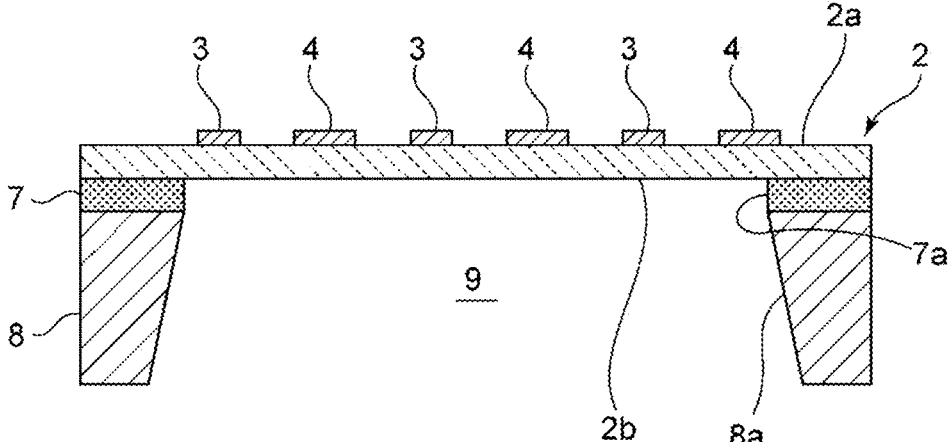

FIG. 1A is a schematic perspective view of an acoustic wave device according to a first preferred embodiment of the present invention, FIG. 1B is a plan view illustrating an electrode structure on a piezoelectric layer, and FIG. 2 is a sectional view of a portion taken along line A-A in FIG. 1A.

An acoustic wave device 1 includes a piezoelectric layer 2 made of $LiNbO_3$, for example. The piezoelectric layer 2 may be made of $LiTaO_3$, for example. The thickness of the piezoelectric layer 2 is preferably, for example, from about 50 nm or more to about 1000 nm or less to utilize a thickness shear primary mode. Moreover, cut-angles in the piezoelectric layer 2 are Z-cut in the present preferred embodiment, but the cut-angles may be rotated Y-cut or X-cut. Furthermore, propagation orientations preferably include, for example, Y-propagation and/or X-propagation of about ±30°.

As shown in FIG. 1B, the electrodes 3 and 4 have a rectangular or substantially rectangular shape and extend in a longitudinal direction. A direction orthogonal or substantially orthogonal to the longitudinal direction of the electrodes 3 and 4 is the width direction of the electrodes 3 and 4. The widths of the electrodes 3 and 4 refer to dimensions taken along the width direction of the electrodes 3 and 4.

The electrodes 3 and 4 include a first electrode and a second electrode that have sectional shapes different from each other in any cross section in a direction orthogonal or substantially orthogonal to the longitudinal direction of the electrodes 3 and 4. More specifically, in the present preferred embodiment, the width of the electrode 4 is larger than the width of the electrode 3. Accordingly, for example, the electrode 3 representing the first electrode and the electrode 4 representing the second electrode have different sectional shapes in a cross section taken along line P-P in FIG. 1B, that is, in a cross section orthogonal or substantially orthogonal to the longitudinal direction of the electrodes 3 and 4. The acoustic wave device 1 according to the present preferred embodiment includes the electrodes 3 and 4 configured as described above, thus allowing control of the magnitude or position of a spurious response. This will be described in more detail later with reference to the specific examples.

The piezoelectric layer 2 includes a first main surface 2a and a second main surface 2b that are opposed to each other. At least one pair of the electrodes 3 and 4 is disposed on the first main surface 2a. In FIGS. 1A and 1B, a plurality of the electrodes 3 are connected to a first busbar 5. A plurality of the electrodes 4 are connected to a second busbar 6. The plurality of the electrodes 3 and the plurality of the electrodes 4 are interdigitated. The electrode 3 and the electrode 4 are opposed to each other in a direction orthogonal or substantially orthogonal to the thickness direction of the piezoelectric layer 2. Moreover, the electrode 3 and the electrode 4 have a rectangular or substantially rectangular shape extending a longitudinal direction. In a direction orthogonal or substantially orthogonal to the longitudinal direction, the electrode 3 and the electrode 4 adjacent to the electrode 3 are opposed to each other. Both of the longitudinal direction of the electrodes 3 and 4 and the direction orthogonal or substantially orthogonal to the longitudinal direction of the electrodes 3 and 4 are directions intersecting the thickness direction of the piezoelectric layer 2. Therefore, it can also be said that the electrode 3 and the electrode 4 adjacent thereto are opposed to each other in a direction intersecting the thickness direction of the piezoelectric layer 2. Further, the longitudinal direction of the electrodes 3 and 4 may be exchanged with the direction orthogonal or substantially orthogonal to the longitudinal direction of the electrodes 3 and 4 illustrated in FIGS. 1A and 1B. That is, the electrodes 3 and 4 may extend in a direction in which the first busbar 5 and the second busbar 6 extend in FIGS. 1A and 1B. In this case, the first busbar 5 and the second busbar 6 extend in the direction in which the electrodes 3 and 4 extend in FIGS. 1A and 1B. Furthermore, the electrode 3 connected to one potential and the electrode 4 connected to the other potential adjacent to each other define a pair, and a plurality of the pairs are disposed in the direction orthogonal or substantially orthogonal to the longitudinal direction of the electrodes 3 and 4. The number of the pairs does not have to be an integer, and the pairs may be 1.5 pairs or 2.5 pairs, for example.

A support member 8 is disposed on the second main surface 2b side of the piezoelectric layer 2 with an insulation layer 7 interposed therebetween. The insulation layer 7 and the support member 8 have a frame shape and include a cavity 7a and a cavity 8a, respectively, as illustrated in FIG. 2. This defines an air gap 9. The air gap 9 is disposed so as not to interrupt vibration in an excitation region of the piezoelectric layer 2. That is, in plan view, the air gap 9 is provided on an opposite side from a side on which at least one pair of the electrodes 3 and 4 is disposed, in a region overlapping with at least a portion of a portion including at least one pair of the electrodes 3 and 4. Thus, the support member 8 is laminated on the second main surface 2b with the insulation layer 7 interposed therebetween, in a position which does not overlap with the portion including at least one pair of the electrodes 3 and 4. Here, the insulation layer 7 does not necessarily have to be provided. Thus, the support member can be directly or indirectly laminated on the second main surface 2b of the piezoelectric layer 2. In plan view, the support member 8 may be disposed not only in a position non-overlapping with the portion including at least one pair of the electrodes 3 and 4, but also in a position overlapping with the portion including at least one pair of the electrodes 3 and 4. In this case, in plan view, the air gap 9 is disposed between the piezoelectric layer 2 and the support member 8 in the position overlapping with the portion including at least a pair of the electrodes 3 and 4.

The insulation layer 7 is made of silicon oxide. An appropriate insulating material such as silicon oxynitride or alumina can also be employed other than silicon oxide. The support member 8 is made of Si. A plane orientation of Si on the piezoelectric layer 2 side may be (100), or may also be (110) or (111). Moreover preferably, Si having high resistance with a resistivity of 4 kΩ or more is desirable. In addition, the support member 8 can also be composed of another insulating material or semiconductor material.

The plurality of the electrodes 3 and 4 and the first and second busbars 5 and 6 are made of an appropriate metal or alloy such as, for example, Al and AlCu alloy. In the present preferred embodiment, the electrodes 3 and 4 have a structure in which an Al film is laminated on a Ti film, for example. Ti film is an adhesion layer, and the adhesion layer may be made of a material other than Ti.

During driving, an AC voltage is applied between the plurality of the electrodes 3 and the plurality of the electrodes 4. More specifically, an AC voltage is applied between the first busbar 5 and the second busbar 6. This allows resonance characteristics to be provided using bulk waves in a thickness shear primary mode that are excited in the piezoelectric layer 2. Moreover, in the acoustic wave device 1, when d is the thickness of the piezoelectric layer 2 and p is a distance between centers of any of the electrodes 3 and 4 adjacent to each other among the plurality of pairs of the electrodes 3 and 4, d/p is, for example, about 0.5 or less. Therefore, the bulk waves in a thickness shear primary mode are effectively excited and good resonance characteristics can be obtained. More preferably, d/p is, for example, about 0.24 or less, and such case can provide better resonance characteristics.

Note that electrodes 3 and 4 adjacent to each other refer to a state in which the electrodes 3 and 4 are arranged adjacent to each other with a space interposed therebetween, rather than a state in which the electrodes 3 and 4 are in direct contact with each other. Moreover, when the electrodes 3 and 4 are adjacent to each other, no electrode is connected, between the electrodes 3 and 4, to a hot electrode or a ground electrode including the electrodes 3 and 4. Furthermore, when a plurality of at least one of the electrodes 3 and 4 is present (when 1.5 or more pairs of electrodes are present with respect to the electrodes 3 and 4 as one pair of electrodes), a distance between centers of the electrodes 3 and 4 refers to the mean value of respective distances between centers of the electrodes 3 and 4 adjacent to each other in the 1.5 or more pairs of the electrodes 3 and 4.

In addition, a distance between centers of the electrodes 3 and 4 represents a distance derived by connecting the center of a dimension (width dimension) of the electrode 3 in a direction orthogonal or substantially orthogonal to the longitudinal direction of the electrode 3 and the center of a dimension (width dimension) of the electrode 4 in a direction orthogonal or substantially orthogonal to the longitudinal direction of the electrode 4.

Moreover, the present preferred embodiment includes a Z-cut piezoelectric layer and therefore, a direction orthogonal or substantially orthogonal to the longitudinal direction of the electrodes 3 and 4 is a direction orthogonal or substantially orthogonal to a polarization direction of the piezoelectric layer 2. This does not apply when a piezoelectric material with other cut-angles is used as the piezoelectric layer 2. Here, "orthogonal" is not limitedly used for an exactly orthogonal case but may be used for a substantially orthogonal case (an angle between a direction orthogonal to the longitudinal direction of the electrodes 3 and 4 and a polarization direction PZ1 is, for example, about 90°±10°).

Since the acoustic wave device 1 according to the present preferred embodiment has the above-described configuration, a Q value does not easily decrease even when the number of pairs of the electrodes 3 and 4 is reduced to achieve size reduction. This is because waves can be trapped even with a small number of reflective electrode fingers in reflectors, thus providing less propagation loss. That is also because of use of bulk waves in a thickness shear primary mode. A difference between Lamb waves used in an acoustic wave device of the related art and the bulk waves in a thickness shear primary mode described above will be described with reference to FIGS. 3A and 3B.

Figure 3A:
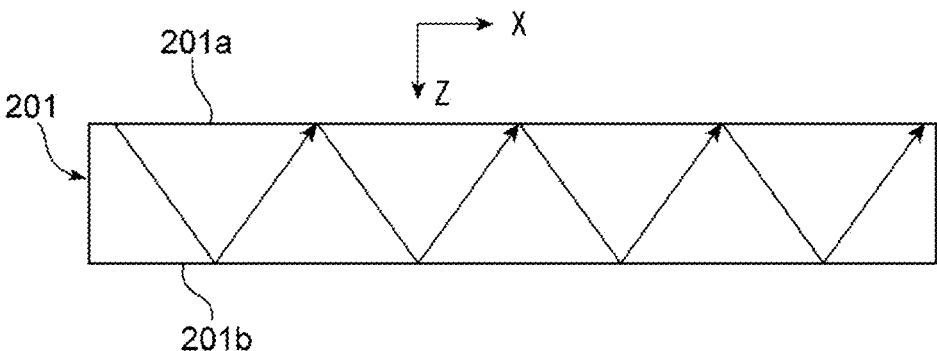
FIG. 3A is a schematic elevational sectional view for explaining Lamb waves that propagate through a piezoelectric film of an acoustic wave device of the related art.

FIG. 3A is a schematic elevational sectional view for explaining Lamb waves that propagate through a piezoelectric film of an acoustic wave device as described in Japanese Unexamined Patent Application Publication No. 2012-257019. In this case, the wave propagates in a piezoelectric film 201 as illustrated with arrows. Here, a first main surface 201a and a second main surface 201b are opposed to each other in the piezoelectric film 201, and a thickness direction connecting the first main surface 201*a* and the second main surface 201*b* is the Z direction. The X direction is a direction in which electrode fingers of an IDT electrode are aligned. As illustrated in FIG. 3A, in the case of a Lamb wave, the wave propagates in the X direction as illustrated in the drawing. Even though the entire piezoelectric film 201 vibrates, the wave propagates in the X direction because the wave is a plate wave. Therefore, reflectors are provided on both sides so as to obtain resonance characteristics. Consequently, when size reduction is intended, that is, when the number of pairs of reflective electrode fingers in reflectors is reduced, wave propagation loss is generated, leading to decrease in a Q value.

Figure 3B:
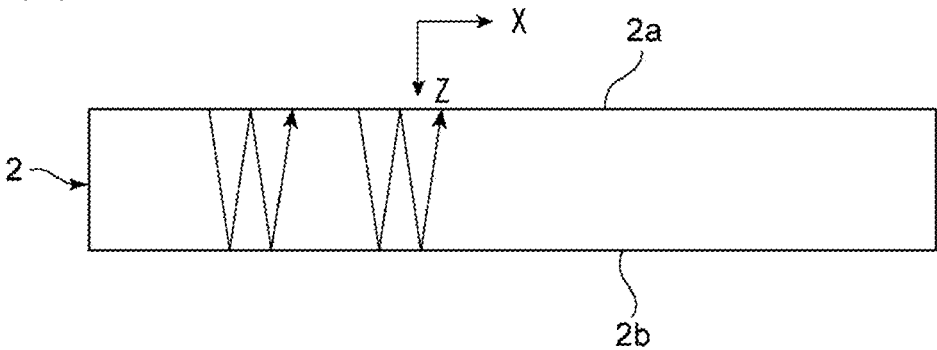
FIG. 3B is a schematic elevational sectional view for explaining bulk waves in a thickness shear primary mode that propagate through a piezoelectric layer in an acoustic wave device according to a preferred embodiment of the present invention.

On the other hand, vibration displacement is in a thickness shear direction in the acoustic wave device according to the present preferred embodiment. Therefore, a wave primarily propagates and resonates in the direction connecting the first main surface 2*a* and the second main surface 2*b* of the piezoelectric layer 2, namely, in the Z direction as illustrated in FIG. 3B. That is, X-direction components of the wave are markedly smaller than Z-direction components. The wave propagation in the Z direction provides resonance characteristics and thus reflectors are not necessarily provided. Accordingly, even when the number of pairs of electrodes including the electrodes 3 and 4 is reduced to achieve size reduction, a Q value does not easily decrease.

In the acoustic wave device 1, at least one pair of electrodes including the electrode 3 and the electrode 4 is arranged as described above, but does not propagate waves in the X direction, and thus the number of pairs of electrodes of the electrodes 3 and 4 need not necessarily be a plurality of pairs. That is, it is sufficient that at least one pair of electrodes is provided.

Figure 4:
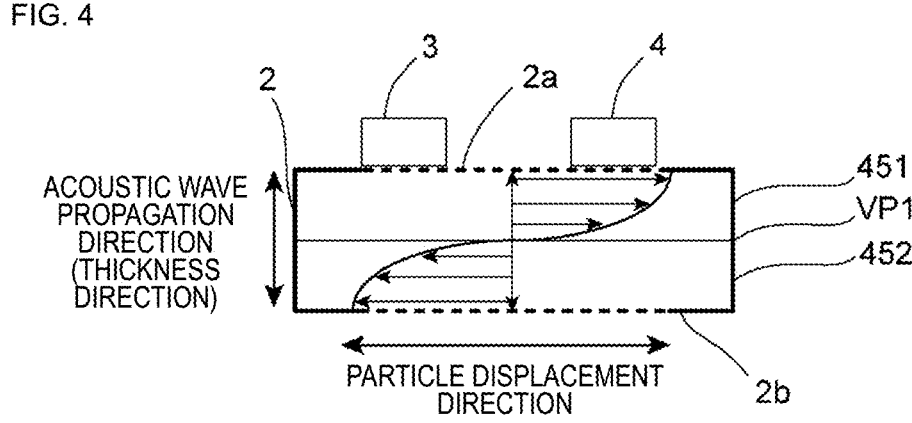
FIG. 4 is a diagram illustrating an amplitude direction of bulk waves in a thickness shear primary mode.

The amplitude directions of bulk waves in a thickness shear primary mode are opposite from each other between a first region 451 included in an excitation region of the piezoelectric layer 2 and a second region 452 included in the excitation region, as illustrated in FIG. 4. FIG. 4 schematically illustrates a bulk wave in the case of applying, between the electrode 3 and the electrode 4, a voltage to provide the electrode 4 with a higher potential than the electrode 3. The first region 451 is between the first main surface 2*a* and a virtual plane VP1, which is orthogonal or substantially orthogonal to the thickness direction of the piezoelectric layer 2 and divides the piezoelectric layer 2 into two, in the excitation region. The second region 452 is between the virtual plane VP1 and the second main surface 2*b*, in the excitation region.

For example, the electrode 3 is an electrode connected to a hot potential and the electrode 4 is an electrode connected to a ground potential. However, the electrode 3 may be connected to a ground potential and the electrode 4 may be connected to a hot potential. In the present preferred embodiment, at least one pair of electrodes is an electrode connected to a hot potential or an electrode connected to a ground potential as described above, and no floating electrodes are provided.

Next, a comparison of Examples 1 to 3 described below will be provided to show that the acoustic wave device 1 according to the present preferred embodiment can control the magnitude and position of a spurious response. All of Examples 1 to 3 include a LiNbO₃ film with Euler angles (about 0°, about 0°, about 90°) as the piezoelectric layer 2. The thickness was about 400 nm.

A pitch, which is a distance between centers of the electrodes 3 and 4, was about 3 μm. As a material for the electrodes 3 and 4, a structure of an Al film with a thickness of about 100 nm laminated on a Ti film of about 10 nm was used. The width direction dimension of the electrode 3 and the width direction dimension of the electrode 4 were as shown in Table 1 below. Accordingly, d/p is about 0.133, for example.

The length of a region including overlap of the electrodes 3 and 4 as viewed in a direction orthogonal or substantially orthogonal to the longitudinal direction of the electrodes 3 and 4, that is, an excitation region, was about 20 μm. The number of pairs of the electrodes 3 and 4 was 100.

TABLE 1

|  | Width of electrode 3 (nm) | Width of electrode 4 (nm) |
|---|---|---|
| Example 1 | 300 | 400 |
| Example 2 | 300 | 600 |
| Example 3 | 500 | 600 |

Figure 5:
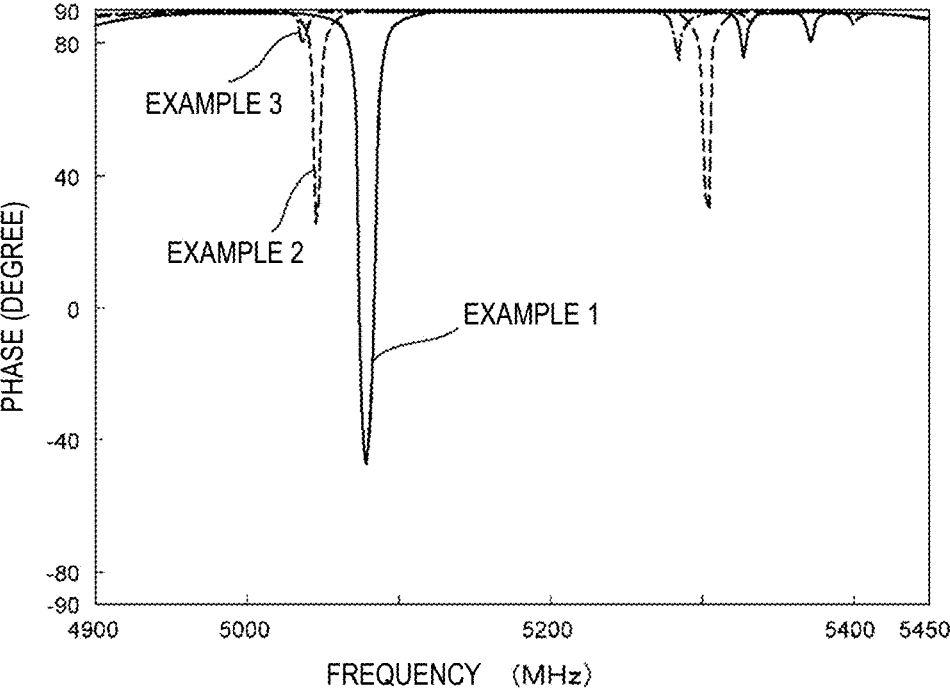
FIG. 5 is a diagram illustrating phase characteristics of resonators in Examples 1 to 3.

FIG. 5 is a diagram illustrating phase characteristics of resonators in Examples 1 to 3 described above. As apparent from FIG. 5, providing a difference between the width of the electrode 3 and the width of the electrode 4 as described above as in Examples 1 to 3 results in changes in the magnitude and position of a spurious response around about 5040 MHz to about 5070 MHz and the magnitude and position of a spurious response around about 5280 MHz to about 5400 MHz. Thus, since the acoustic wave device according to the present preferred embodiment includes electrodes, each with a sectional shape different from that of the other electrode in any cross section in a direction orthogonal or substantially orthogonal to the longitudinal direction of a pair of the electrodes 3 and 4 as described above, adjustment of the manner of difference enables reducing a spurious response or shifting a spurious response to a position spaced apart from a band.

Note that, although the width of the electrode 3 and the width of the electrode 4 are different in the first preferred embodiment, all of the electrodes 3 need not have an equal or substantially equal width in a plurality of pairs of the electrodes 3 and 4. The widths of the electrodes 4 also need not all be equal or substantially equal. The arrangement of a plurality of pairs of the electrodes 3 and 4 preferably includes electrodes with different sectional shapes in any cross section in a direction orthogonal or substantially orthogonal to the longitudinal direction of the electrodes 3 and 4.

Further, when d is the thickness of the piezoelectric layer 2 and p is the distance between electrode centers of the electrodes 3 and 4, d/p is, for example, about 0.5 or less, and more preferably about 0.24 or less as described above, in the present preferred embodiment. This will be described with reference to FIGS. 6A and 6B.

Figure 6A:
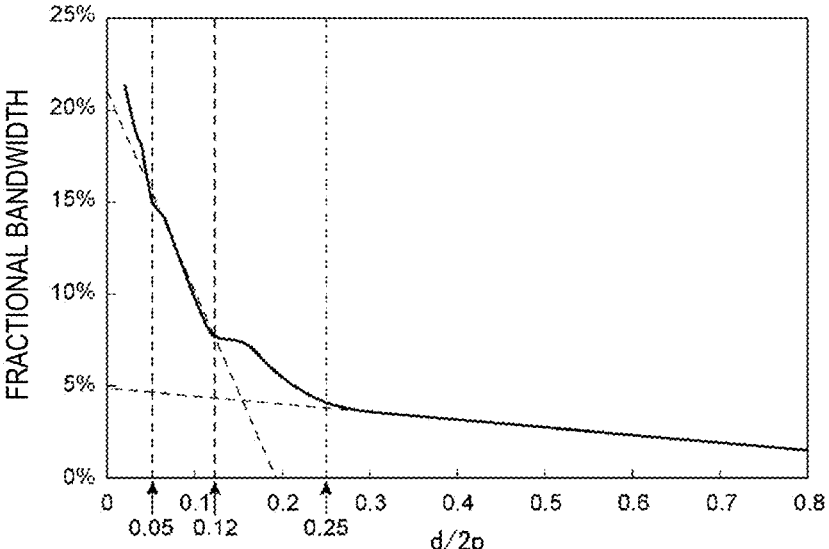
FIG. 6A is a diagram illustrating a relationship between d/2p and a fractional bandwidth as a resonator when p is a distance between centers of electrodes adjacent to each other or the mean distance thereof and d is a thickness of the piezoelectric layer.
Figure 6B:
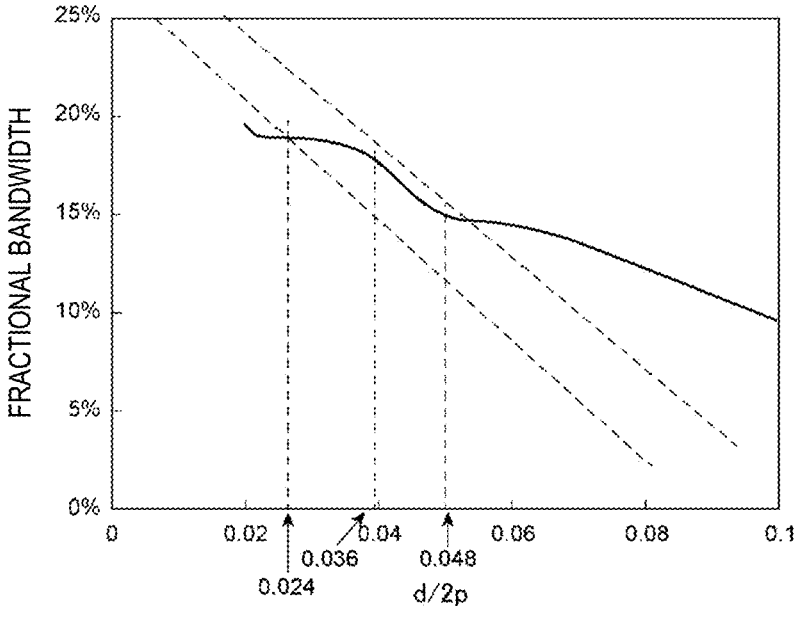
FIG. 6B is a diagram illustrating a relationship between d/2p and a fractional bandwidth as a resonator when p is a distance between centers of electrodes adjacent to each other or the mean distance thereof and d is a thickness of the piezoelectric layer.

A plurality of acoustic wave devices having different d/2p were produced. FIGS. 6A and 6B are diagrams illustrating a relationship between the d/2p and a fractional bandwidth as a resonator of the acoustic wave device.

As shown in FIG. 6A, when d/2p exceeds about 0.25, that is, when d/p>about 0.5, the fractional bandwidth is less than about 5% even when d/p is adjusted. In contrast, when d/2p about 0.25, that is, when d/p about 0.5, the fractional bandwidth can be set to about 5% or more by changing d/p within the range, in other words, a resonator having a high coupling coefficient can be configured. Moreover, when d/2p is about 0.12 or less, that is, when d/p is about 0.24 or less, the fractional bandwidth can be increased to about 7% or more. More preferably, when d/2p is about 0.05 or less, that is, when d/p is about 0.025 or less, the coupling coefficient can be further increased. In addition to this, adjustment of d/p within this range provides a resonator having a wider fractional bandwidth, and enables a resonator having a higher coupling coefficient to be obtained. This suggests that a resonator which uses the bulk waves in a thickness shear primary mode described above and has a high coupling coefficient can be configured by setting d/p to about 0.5 or less, for example. Additionally, as shown in FIG. 6B, d/2p is more preferably about 0.048 or less, for example. In this case, the coupling coefficient can be further increased. More preferably, d/2p is in the range of about 0.024 or more to about 0.036 or less, for example. In this case, the coupling coefficient is changed less even when the pitch p varies.

Note that at least one pair of electrodes may be one pair as described above, and the p in a pair of electrodes is a distance between centers of the electrodes 3 and 4 adjacent to each other. Additionally, in 1.5 or more pairs of electrodes, the mean distance of distances between centers of the electrodes 3 and 4 adjacent to each other is defined as p.

Figure 7:
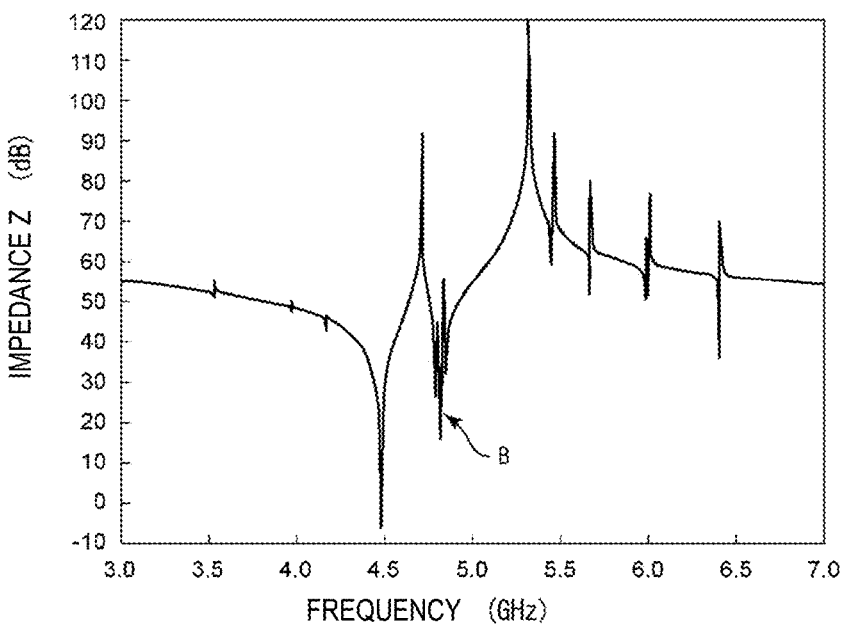
FIG. 7 is a diagram illustrating resonance characteristics of an acoustic wave device of a reference example where a spurious response appears.

In the acoustic wave device 1, it is preferable that a metallization ratio MR of at least one pair of the electrodes 3 and 4 satisfies MR≤1.75 (d/p)+0.075 with respect to an excitation region, which is a region including overlap of at least one pair of the electrodes 3 and 4 as viewed in a direction where the electrodes 3 and 4 are opposed to each other. This case can effectively reduce a spurious response. This will be described with reference to FIG. 7 and FIG. 8. FIG. 7 is a reference diagram illustrating an example of resonance characteristics of the acoustic wave device 1. A spurious response shown with an arrow B is present between a resonant frequency and an anti-resonant frequency. Here, it is defined that d/p=about 0.08 and Euler angles of LiNbO₃ is (about 0°, about 0°, about 90°). Further, the metallization ratio MR described above is defined as MR=about 0.35.

The metallization ratio MR will be described with reference to FIG. 1B. Focusing on one pair of electrodes 3 and 4 in the electrode structure of FIG. 1B, it is assumed that only this pair of electrodes 3 and 4 is provided. In this case, a portion enclosed by a dashed-dotted line C is an excitation region. This excitation region includes a region of the electrode 3 in which the electrode 3 overlaps with the electrode 4, a region of the electrode 4 in which the electrode 4 overlaps with the electrode 3, and a region in which the electrode 3 and the electrode 4 overlap with each other in a region between the electrode 3 and the electrode 4, when the electrode 3 and the electrode 4 are viewed in the direction orthogonal or substantially orthogonal to the longitudinal direction of the electrodes 3 and 4, that is, in the opposing direction thereof. An area of the electrodes 3 and 4 in the excitation region C with respect to an area of the excitation region is the metallization ratio MR. Namely, the metallization ratio MR is a ratio of an area of a metallization portion with respect to an area of an excitation region.

When a plurality of pairs of electrodes are provided, MR may be set to a ratio of metallization portions included in all excitation regions with respect to a total of areas of the excitation regions.

Figure 8:
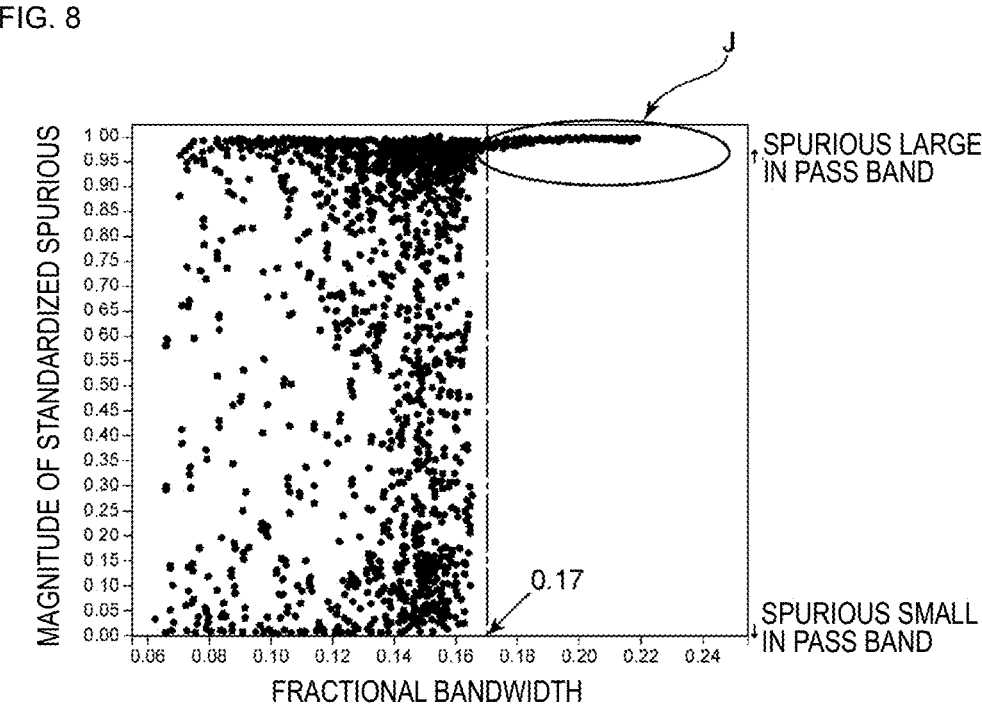
FIG. 8 is a diagram illustrating a relationship between a fractional bandwidth and the magnitude of a standardized spurious response.

FIG. 8 is a diagram illustrating a relationship between fractional bandwidths obtained in configuring multiple acoustic wave resonators and phase rotation amounts of impedance of spurious which is standardized at about 180 degrees as the magnitudes of spurious responses, in accordance with the present preferred embodiment. Here, the fractional bandwidths are adjusted by variously changing the film thickness of piezoelectric layers and the dimension of electrodes. FIG. 8 illustrates results obtained when piezoelectric layers made of Z-cut LiNbO₃ were used, but a similar tendency is obtained when piezoelectric layers of other cut-angles are used.

A region enclosed with an ellipse J in FIG. 8 has a large spurious response which is about 1.0. As shown in FIG. 8, when the fractional bandwidth exceeds about 0.17, that is, exceeds about 17%, a large spurious response whose spurious level is about 1 or greater appears in a pass band even when parameters for the fractional bandwidth are changed. In other words, a large spurious response indicated by arrow B appears in the band as the resonance characteristics shown in FIG. 7. Consequently, the fractional bandwidth is preferably about 17% or less, for example. In this case, a spurious response can be reduced by adjusting the film thickness of the piezoelectric layer 2 and the dimensions of the electrodes 3 and 4, for example.

Figure 9:
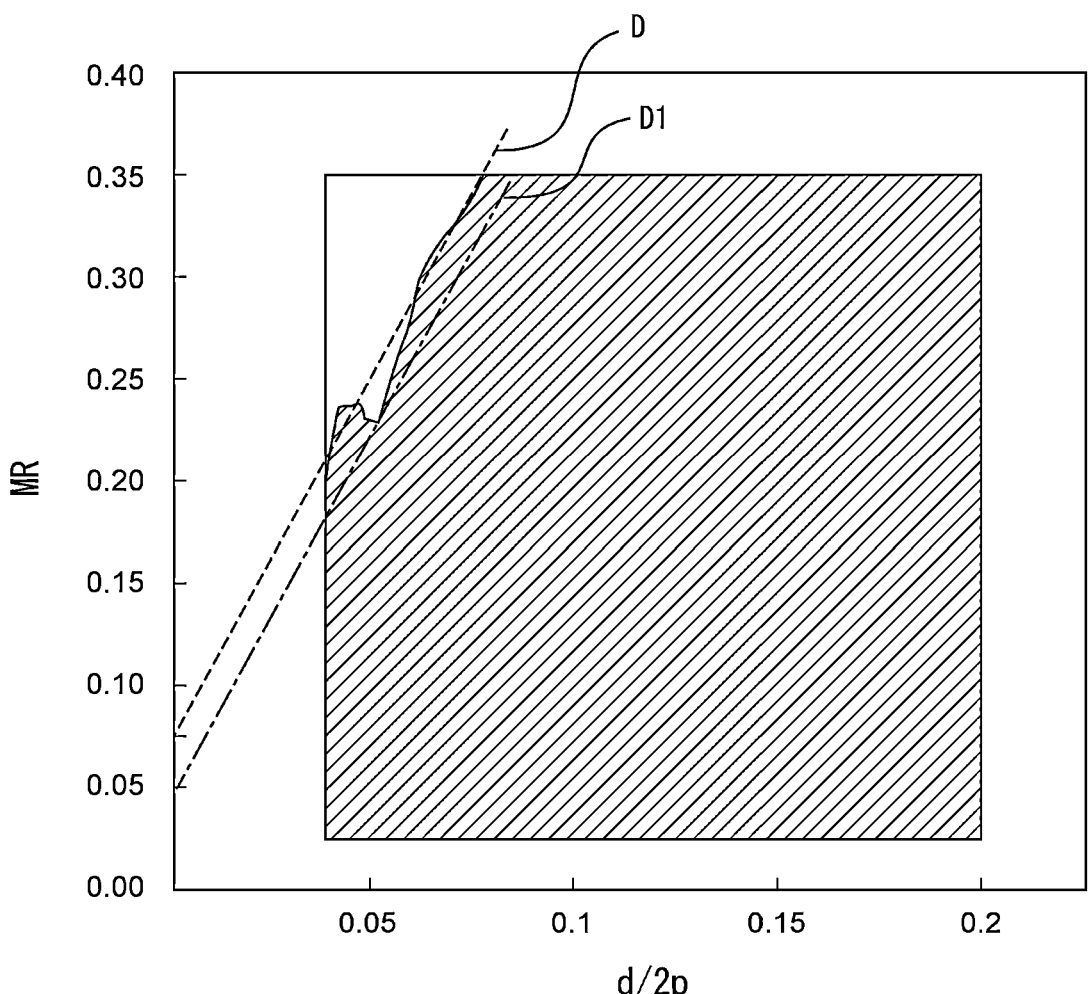
FIG. 9 is a diagram illustrating a relationship among d/2p, a metallization ratio MR, and a fractional bandwidth.

FIG. 9 is a diagram illustrating a relationship among d/2p, a metallization ratio MR, and a fractional bandwidth. In terms of the acoustic wave device described above, various acoustic wave devices having different d/2p and MR were configured and fractional bandwidths were measured. A hatched portion on the right side of a dashed line D in FIG. 9 is a region in which a fractional bandwidth is about 17% or less. A boundary between the hatched region and a non-hatched region is expressed as MR=3.5(d/2p)+0.075. That is, MR=1.75(d/p)+0.075 is satisfied. Accordingly, MR≤1.75(d/p)+0.075 is preferably satisfied. This case makes it easier to set the fractional bandwidth to about 17% or less. A region on the right side of MR=3.5(d/2p)+0.05 represented by a dashed-dotted line D1 in FIG. 9 is more preferable. Namely, when MR≤1.75(d/p)+0.05 is satisfied, the fractional bandwidth can be securely set to about 17% or less.

Figure 10:
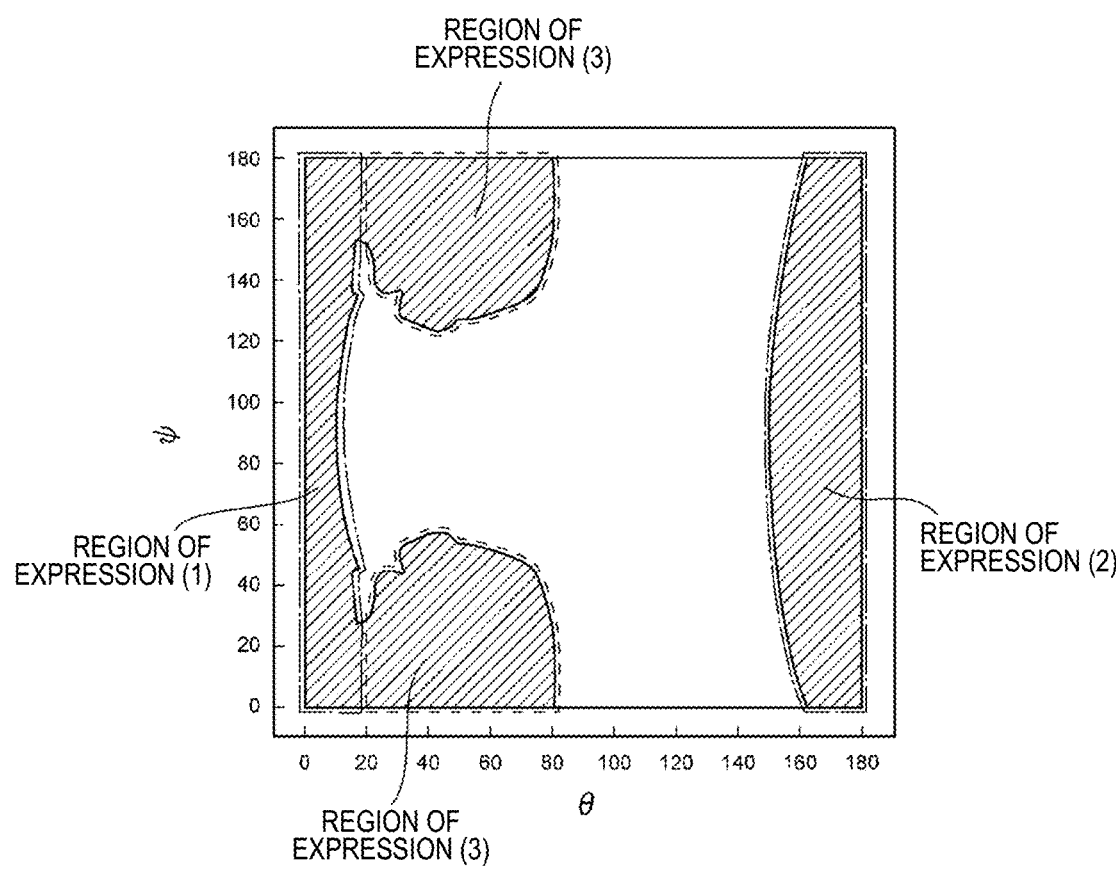
FIG. 10 is a diagram showing a map of a fractional bandwidth in approximating d/p to 0 as much as possible in $LiNbO_3$ with Euler angles $(0°, \theta, \psi)$.

FIG. 10 is a diagram showing a map of a fractional bandwidth obtained by approximating d/p to 0 as much as possible for Euler angles (0°, θ, ψ) of LiNbO₃. Hatched portions in FIG. 10 represent regions E, F, G, and H that provide a fractional bandwidth of at least 5% or more. Approximation of the ranges of the regions E, F, G, and H provides ranges represented by the following Expression (1), Expression (2), and Expression (3).

$$(0°\pm10°, \ 0° \text{ to } 20°, \text{ any } \psi) \qquad \text{Expression (1)} \ldots \text{Region E}$$

$$(0°\pm10°, \ 20° \text{ to } 80°, \ 0° \text{ to } 60°(1-(\theta-50)^2/900)^{1/2}) \text{ or}$$
$$(0°\pm10°, \ 20° \text{ to } 80°, \ [180°-60°(1-(\theta-50)^2/900)^{1/2}] \text{ to } 180°) \qquad \text{Expression (2)} \ldots \text{Region F or G}$$

$$(0°\pm10°, \ [180°-30°(1-(\psi-90)^2/8100)^{1/2}] \text{ to } 180°, \text{ any } \psi) \qquad \text{Expression (3)} \ldots \text{Region H}$$

Thus, in the Euler-angle ranges of Expression (1), Expression (2), or Expression (3) described above, the fractional bandwidth can preferably be sufficiently expanded.

As described above, the acoustic wave devices according to preferred embodiments of the present invention achieve good resonance characteristics even with a reduced number of electrode fingers in reflectors, and thus achieving a high Q value even when size reduction is achieved. Moreover, providing a difference between the electrode 3 and the electrode 4 in a sectional shape in any cross section in a direction orthogonal or substantially orthogonal to the longitudinal direction of the electrodes 3 and allows control of the magnitude or position of a spurious response.

Figure 11:
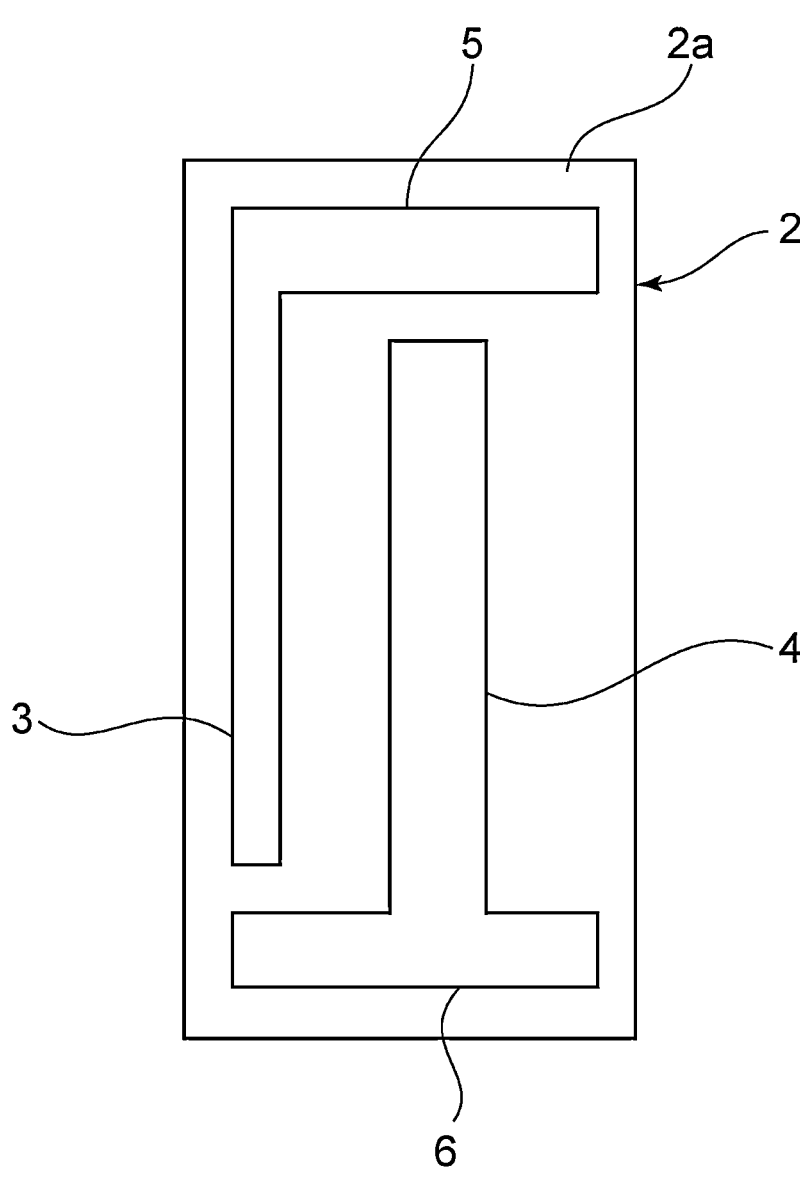
FIG. 11 is a plan view of an electrode structure of an acoustic wave device according to a second preferred embodiment of the present invention.

FIG. 11 is a plan view depicting an electrode structure of an acoustic wave device according to a second preferred embodiment of the present invention. In the second preferred embodiment, a pair of the electrodes 3 and 4 are disposed on the piezoelectric layer 2. As such, the number of pairs of electrode structures including the electrodes 3 and 4 may be one. The width of the electrode 4 is wider than the width of the electrode 3. Description will now be provided for other preferred embodiments and modifications of the present invention.

In the acoustic wave device 1 according to the first preferred embodiment, at least one pair of the electrodes 3 and 4 have been configured so as to provide a difference between the width of the electrode 3 and the width of the electrode 4. In this regard, in preferred embodiments of the present invention, the configuration is not limited to one with such different widths, but preferably includes an electrode with a sectional shape different from that of the other electrode in any cross section in a direction orthogonal or substantially orthogonal to the longitudinal direction of a pair of the electrodes 3 and 4, and the configuration thereof may be variously changed.

Figure 12:
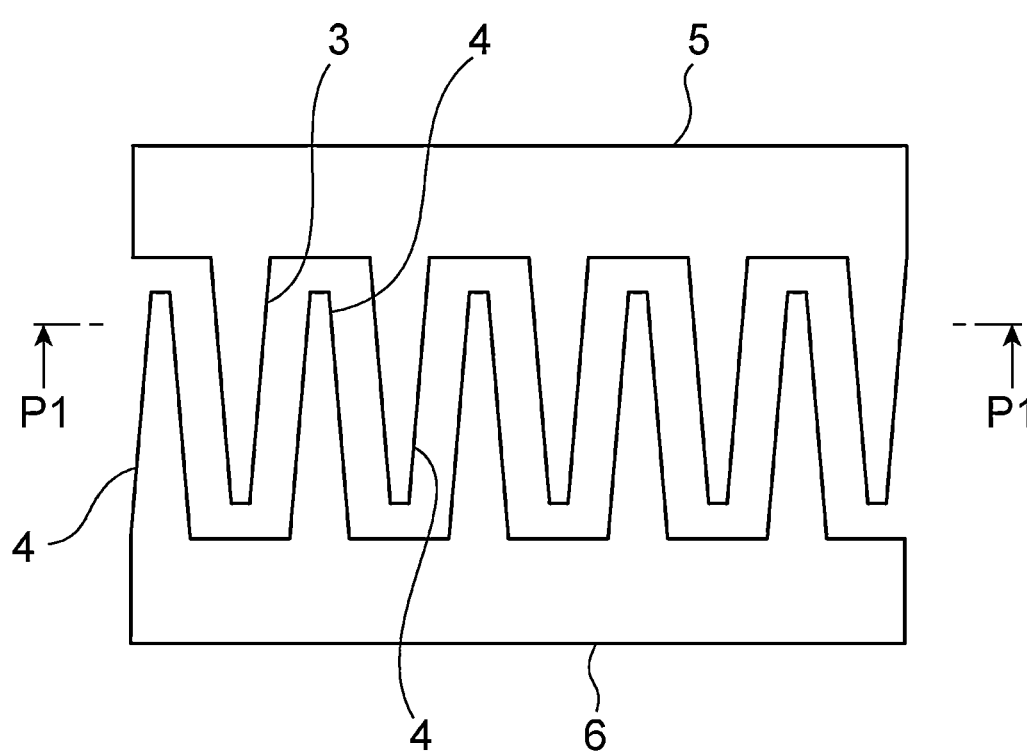
FIG. 12 is a plan view of an electrode structure of an acoustic wave device according to a third preferred embodiment of the present invention.

Referring to FIG. 12 to FIG. 16, description will be provided for electrode structures of acoustic wave devices according to third to seventh preferred embodiments of the present invention. In the acoustic wave device according to the third preferred embodiment as shown in FIG. 12, the electrode 3 and the electrode 4 have a shape tapered so as to become thinner from the base end toward the tip end. In other word, the electrode 3 and the electrode 4 have an isosceles trapezoid shape. In the electrode 3 and the electrode 4, sectional shapes are different between the electrode 3 and the electrode 4 as viewed in any cross section in a direction orthogonal or substantially orthogonal to the longitudinal direction of the electrodes 3 and 4. That is, in the acoustic wave device according to the third preferred embodiment, the electrode 3 represents an example of a "first electrode", and the electrode 4 represents an example of a "second electrode". For example, there is difference between the sectional shape of the electrode 3 and the sectional shape of the electrode 4 in a cross section taken along line P1-P1 in FIG. 12. In this way, providing the electrode 3 or the electrode 4 with a shape other than a rectangle or a substantial rectangle, such as an isosceles trapezoid, for example, allows sectional shapes of the electrodes 3 and 4 to differ from each other in a cross section orthogonal or substantially orthogonal to the longitudinal direction of the electrodes 3 and 4.

In the third preferred embodiment, all of the plurality of the electrodes 3 need not necessarily have the same or substantially the same shape. The same also applies to the plurality of the electrodes 4.

Note that although the electrodes 3 and 4 have an isosceles trapezoid shape, they may have other shapes such as, for example, a non-isosceles trapezoid or a parallelogram.

Figure 13:
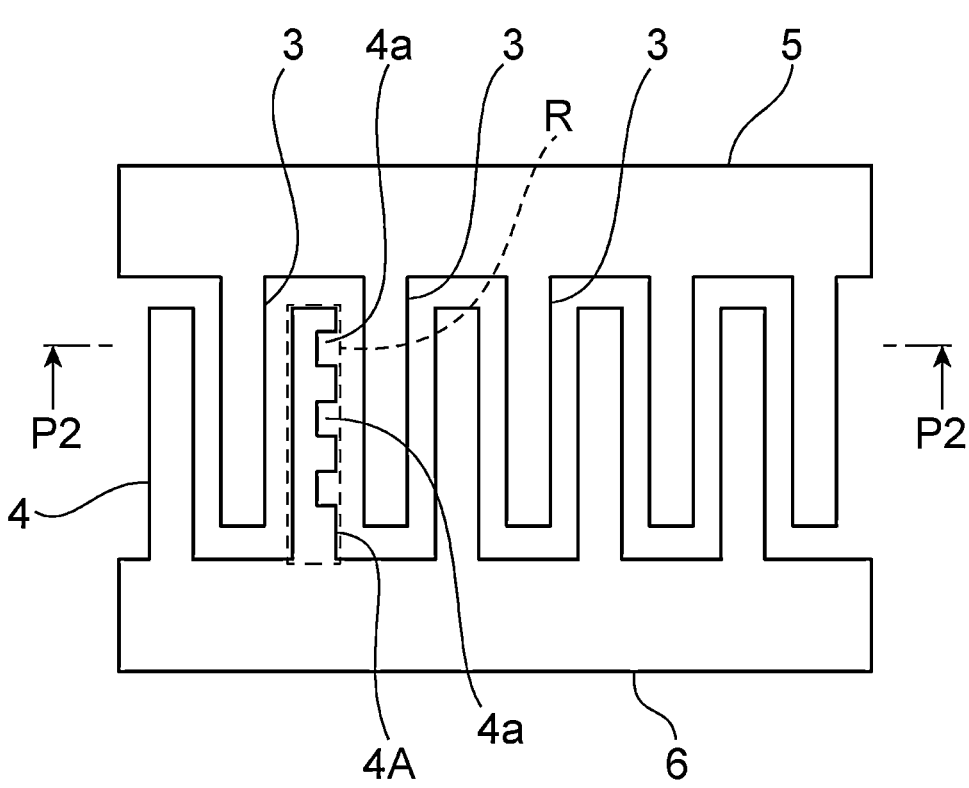
FIG. 13 is a plan view of an electrode structure of an acoustic wave device according to a fourth preferred embodiment of the present invention.

FIG. 13 is a plan view of an electrode structure of an acoustic wave device according to the fourth preferred embodiment. In the fourth preferred embodiment, the electrodes 3 having a rectangular or substantially rectangular shape is connected to the first busbar 5. Moreover, the plurality of the electrodes 4 and an electrode 4A are connected to the second busbar 6. The electrode 4 has a rectangular or substantially rectangular shape, which is a shape the same or substantially the same as the electrode 3. On the other hand, the electrode 4A includes a plurality of recesses 4a on one side extending in the longitudinal direction. This corresponds to a shape where the recesses 4a are disposed on the electrode 4. In this case, the longitudinal direction is a longitudinal direction of a rectangle or a substantial rectangle R circumscribed with the electrode 4A.

Note that although the fourth preferred embodiment includes the recess 4a, it is sufficient that at least one recess 4a is disposed in the electrode 4.

In the fourth preferred embodiment, the sectional shape of the electrode 4A is different from those of other electrodes, the electrodes 3 and 4, in a cross section taken along line P2-P2 passing through a position where the recess 4a is disposed. That is, in the acoustic wave device according to the fourth preferred embodiment, the electrode 4A represents an example of the "first electrode", and the electrode 3 or the electrode 4 represents an example of the "second electrode". Therefore, in this case, adjustment of the sectional shapes of the electrodes 3, 4, and 4A allows control of the magnitude or position of a spurious response.

Figure 14:
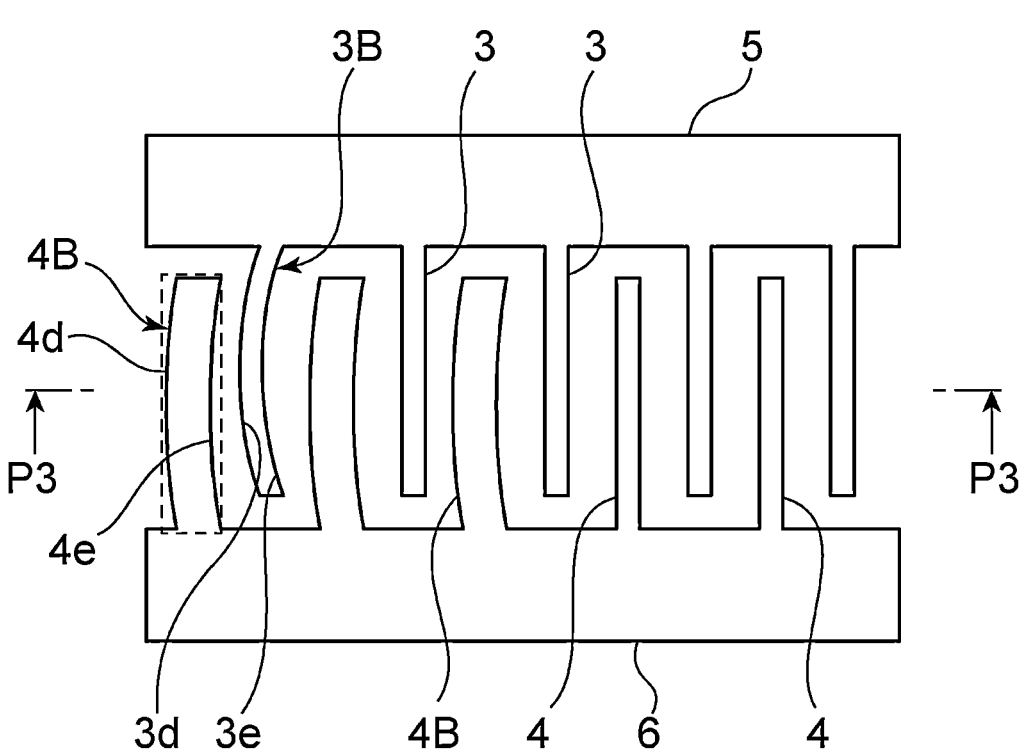
FIG. 14 is a plan view if an electrode structure of an acoustic wave device according to a fifth preferred embodiment of the present invention.

FIG. 14 is a plan view of an electrode structure of an acoustic wave device according to the fifth preferred embodiment. In the acoustic wave device according to the fifth preferred embodiment, one end of each of the plurality of the electrodes 3 and an electrode 3B are connected to the first busbar 5. A plurality of electrodes 4B and a plurality of the electrodes 4 are connected to the second busbar 6. Note that the electrodes 3 and have a rectangular or substantially rectangular shape. In contrast, the electrodes 3B and 4B have a curved shape as shown. In other words, the electrode 3B includes a pair of curved sides 3d and 3e. Similarly, the electrode 4B has a pair of curved sides 4d and 4e. In the electrodes 3B and 4B with such a curved shape, longitudinal directions of rectangular or substantially rectangular shapes circumscribed are the longitudinal directions of the electrodes 3B and 4B. Here, "a rectangular or substantially rectangular shape circumscribed with the electrode 3B or 4B" encompasses at least a rectangular or substantially rectangular shape circumscribed with a position except for a position connected to the first busbar 5 or the second busbar 6 in the electrode 3B or 4B.

In the present preferred embodiment, there is difference between the sectional shape of the electrode 3B and the sectional shape of the electrode 4B in, for example, a cross section taken along line P3-P3. Furthermore, the width of the electrode 4B is larger than the width of the electrode 3 or the electrode 4. That is, the electrode 3B represents an example of the "first electrode", and the electrodes 3, 4, and 4B represent an example of the "second electrode". Alternatively, the electrode 4B represents an example of the "first electrode", and the electrodes 3, 3B, and 4 represent an example of the "second electrode". Therefore, adjustment of the manner of difference in a sectional shape allows adjustment of the magnitude or position of a spurious response, as in the first preferred embodiment.

Figure 15:
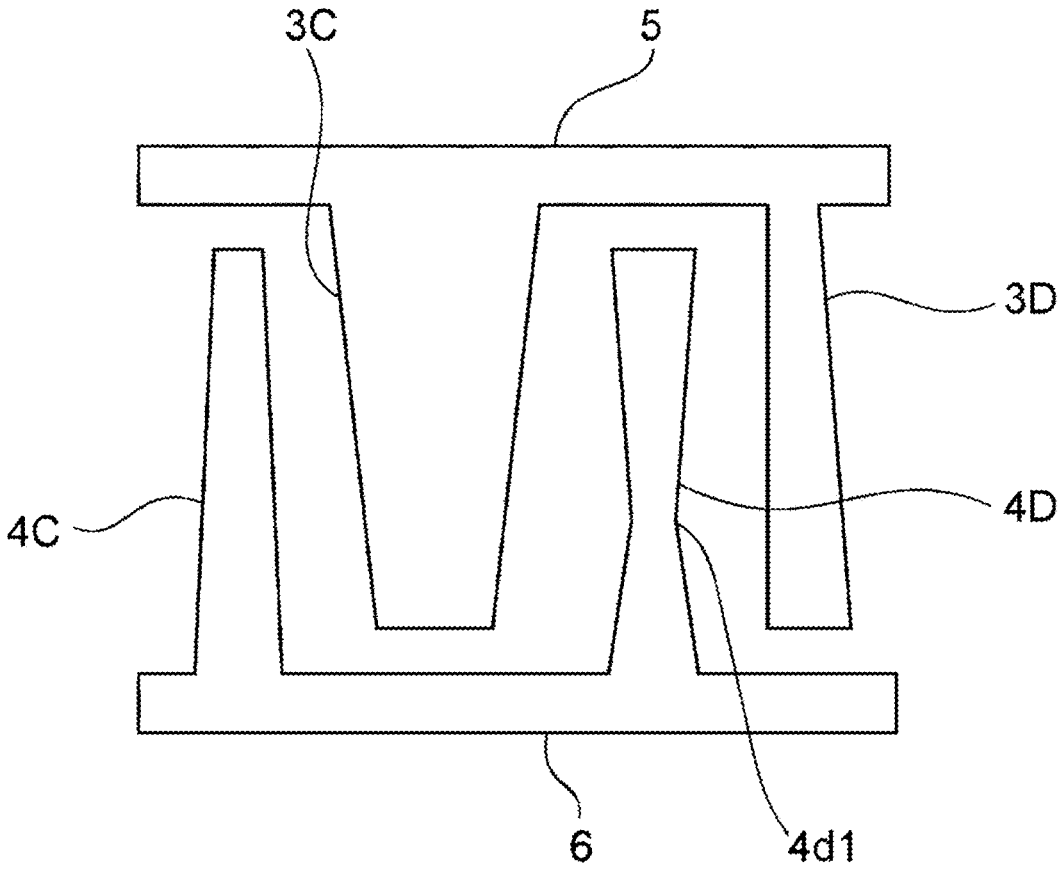
FIG. 15 is a plan view of an electrode structure of an acoustic wave device according to a sixth preferred embodiment of the present invention.

FIG. 15 is a plan view of an electrode structure of an acoustic wave device according to the sixth preferred embodiment. Here, one end of each of electrodes 3C and 3D are connected to the first busbar 5. Moreover, one end of each of electrodes 4C and 4D are connected to the second busbar 6. In other words, two pairs of electrodes, 3C and 4C, and 3D and 4D, are provided. The electrode 3C has an isosceles trapezoid shape. The electrode 4C has a trapezoid shape thinner than the electrode 3C. Furthermore, the electrode 4D has a shape in which a thinner portion 4d1 is disposed in the center or approximate center of the longitudinal direction. The electrode 3D has a shape in which the width becomes wider from the base end toward the tip end. Such various modified-shaped electrodes 3C, 4C, 3D, and 4D other than a rectangle or a substantial rectangle may be used. In this case, electrodes having different electrode shapes are provided in any cross section in a direction orthogonal or substantially rectangular to the longitudinal direction of the electrodes 3C, 4C, 3D, and 4D. That is, any of the electrodes 3C, 4C, 3D, and 4D represents an example of the "first electrode", and the other electrodes represent an example of the "second electrode". Therefore, adjustment of the manner of difference in an electrode shape allows control of the magnitude or position of a spurious response.

Figure 16:
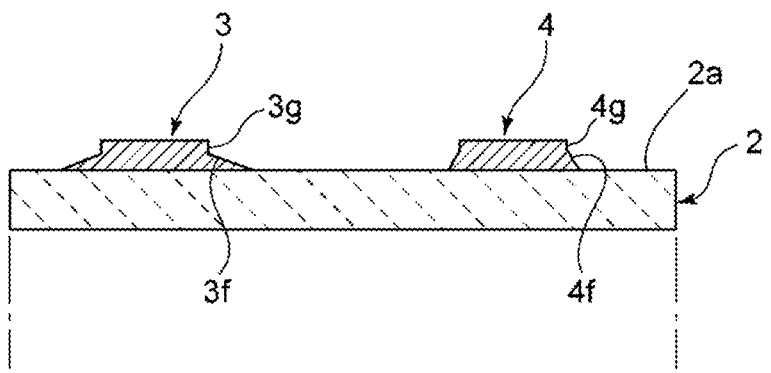
FIG. 16 is an elevational sectional view of an electrode structure of an acoustic wave device according to a seventh preferred embodiment of the present invention.

FIG. 16 is an elevational sectional view of an electrode structure of an acoustic wave device according to the seventh preferred embodiment. In the present preferred embodiment, the electrode 3 and the electrode 4 include wider portions 3*f* and 4*f* on the piezoelectric layer 2, and rectangular or substantially rectangular sectional portions 3*g* and 4*g* disposed on the wider portions 3*f* and 4*f*. The side surfaces of the wider portions 3*f* and 4*f* are tapered so as to become thinner from the first main surface 2*a* side towards the rectangular or substantially rectangular sectional portions 3*g* and 4*g*. In this regard, the taper of the wider portion 4*f* is different from the taper of the wider portion 3*f* such that the side surface of the wider portion 4*f* is inclined more steeply than the side surface of the wider portion 3*f*. Therefore, there is difference between the sectional shape of the electrode 3 and the sectional shape of the electrode 4 in the sectional shape as shown, that is, a cross section in a direction orthogonal or substantially orthogonal to the longitudinal direction of the electrodes 3 and 4. In other words, the electrode 3 represents an example of the "first electrode", and the electrode 4 represents an example of the "second electrode". Therefore, adjustment of the manner of difference allows adjustment of the magnitude or position of a spurious response.

Additionally, in the seventh preferred embodiment, the electrodes 3 and 4 have different inclination angles of the side surfaces of the wider portions 3*f* and 4*f*, but the electrode 3 and the electrode 4 may be configured to have different inclination angles of the entire side surfaces. In other words, the inclination angle of at least a portion of the side surface of the electrode 3 relative to the piezoelectric layer 2 may be different from the inclination angle of at least a portion of the side surface of the electrode 4.

Figures 17, 18:
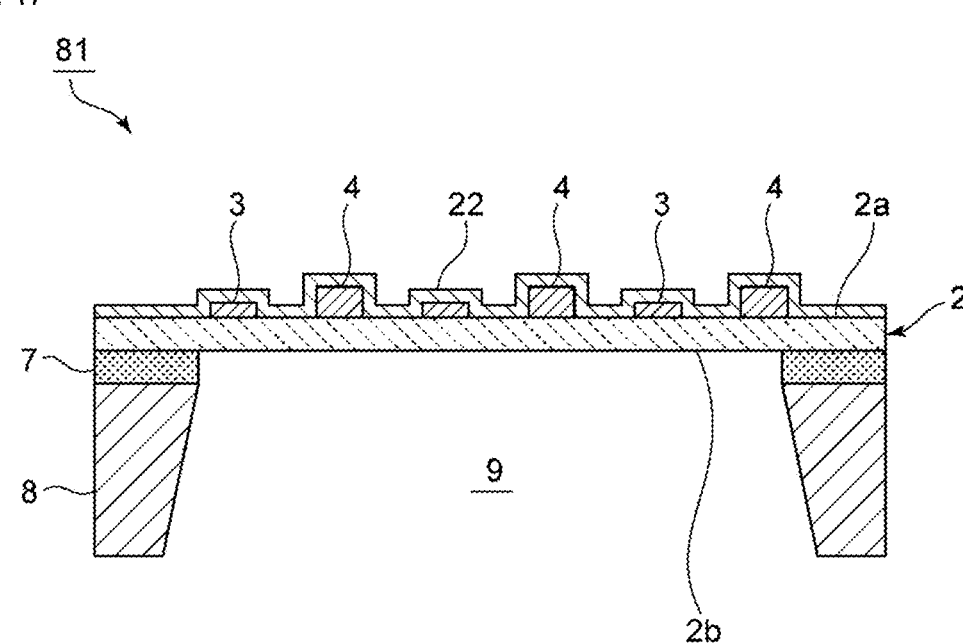
FIG. 17 is an elevational sectional view of an acoustic wave device according to an eighth preferred embodiment of the present invention.
FIG. 18 is an elevational sectional view of an acoustic wave device according to a ninth preferred embodiment of the present invention.

FIG. 17 is an elevational sectional view of an acoustic wave device according to an eighth preferred embodiment of the present invention. In an acoustic wave device 81, the thickness of the electrode 4 is larger than the thickness of the electrode 3. Thus, in the present preferred embodiment, there is difference between the sectional shape of the electrode 3 and the sectional shape of the electrode 4 in a cross section of a direction orthogonal or substantially orthogonal to the longitudinal direction of the electrodes 3 and 4. Therefore, adjustment of the manner of difference allows adjustment of the magnitude or position of a spurious response. Furthermore, a protective film 22 is laminated on the first main surface 2*a* of the piezoelectric layer 2 so as to cover at least one pair of the electrodes 3 and 4. As the protective film 22, an insulating material such as, for example, silicon oxide or silicon oxynitride can be preferably provided. In addition, the protective film 22 also covers a gap region between the electrode 3 and the electrode 4, but may partially cover the gap region.

In the following FIG. 18, FIGS. 19A, 19B, FIGS. 20A, 20B, FIG. 21, and FIG. 22, the structures of the electrodes 3 and 4 are provided similarly to those in the first preferred embodiment. That is, the width of the electrode 4 is larger than the width of the electrode 3. Thus, adjustment of the manner of difference in the width as a sectional shape of the electrode 4 and the electrode 3 allows adjustment of the magnitude or position of a spurious response.

FIG. 18 is an elevational sectional view of an acoustic wave device according to a ninth preferred embodiment of the present invention. In an acoustic wave device 91, the electrodes 3 and 4 having different width are disposed on the first main surface 2*a* of the piezoelectric layer 2, as is in the first preferred embodiment. Moreover, an acoustic multilayer film 42 is laminated on the second main surface 2*b* of the piezoelectric layer 2. The acoustic multilayer film 42 has a layered structure including low-acoustic impedance layers 42*a*, 42*c*, and 42*e*, which have relatively low acoustic impedance, and high-acoustic impedance layers 42*b* and 42*d*, which have relatively high acoustic impedance. Use of the acoustic multilayer film 42 allows bulk waves in a thickness shear primary mode to be trapped within the piezoelectric layer 2, without the air gap 9 in the acoustic wave device 1. In the acoustic wave device 91, setting the d/p to about 0.5 or less allows providing resonance characteristics based on the bulk wave in a thickness shear primary mode. In the acoustic multilayer film 42, the numbers of laminated layers of the low-acoustic impedance layer and the high-acoustic impedance layer are not particularly limited. It is only necessary that at least one layer of the high-acoustic impedance layers is provided at a location farther from the piezoelectric layer 2 than the low-acoustic impedance layer is.

The low-acoustic impedance layers 42*a*, 42*c*, and 42*e* and the high-acoustic impedance layers 42*b* and 42*d* can be made of an appropriate material as long as they satisfy the relationship of acoustic impedance described above. Examples of materials for the low-acoustic impedance layers 42*a*, 42*c*, and 42*e* can include silicon oxide or silicon oxynitride. Moreover, examples of materials for the high-acoustic impedance layers 42*b* and 42*d* can include alumina, silicon nitride, and metal.

Figure 19A:
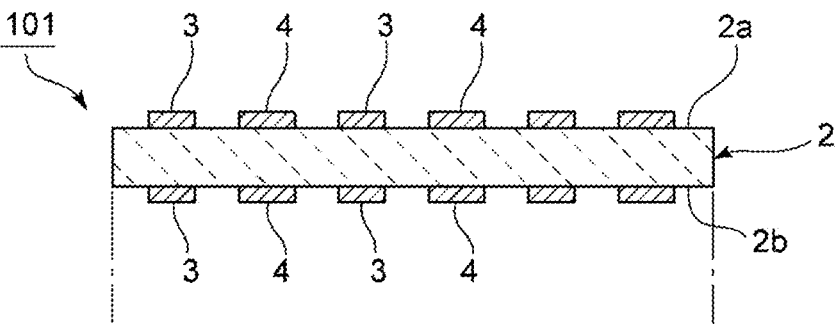
FIG. 19A is an elevational sectional view of an acoustic wave device according to a tenth preferred embodiment of the present invention.
Figure 19B:
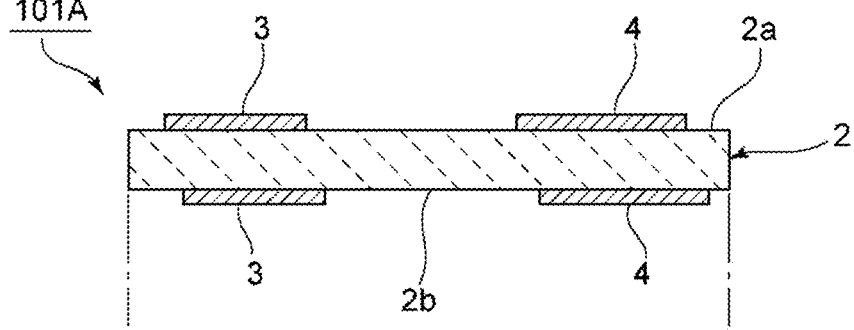
FIG. 19B is an elevational sectional view illustrating a modification thereof.

FIG. 19A is an elevational sectional view of an acoustic wave device according to a tenth preferred embodiment of the present invention, and FIG. 19B is an elevational sectional view of a modification thereof. FIG. 19A shows only a portion of an acoustic wave device 101 according to the tenth preferred embodiment, that is, a portion where the piezoelectric layer 2 and at least one pair of the electrodes 3 and 4 are disposed. In the acoustic wave device 101 according to the tenth preferred embodiment, at least one pair of the electrodes 3 and 4 is disposed on the first main surface 2*a* of the piezoelectric layer 2. Moreover, at least one pair of the electrodes 3 and 4 is also disposed on the second main surface 2*b*. In this way, at least one pair of electrodes may also be disposed on the second main surface 2*b* side. The electrodes 3 and 4 disposed on the second main surface 2*b* preferably overlaps with the electrodes 3 and 4 on the first main surface 2*a*, with the piezoelectric layer 2 interposed therebetween.

In addition, as in an acoustic wave device 101A in the modification of the tenth preferred embodiment shown in FIG. 19B, the electrodes 3 and 4 on the first main surface 2*a* may partially overlap with the electrodes 3 and 4 on the second main surface 2*b*. In other words, it is only necessary that the electrodes 3 and 4 on the first main surface 2*a* overlap at least a portion of the electrodes 3 and 4 on the second main surface 2*b*.

Although illustration is omitted in FIG. 19A, the acoustic wave device 101 is configured similarly to the acoustic wave device 1 except for the piezoelectric layer 2 and the electrodes 3 and 4. This allows producing good resonance characteristics by bulk waves in a thickness shear primary mode, and increasing a Q value even in promoting size reduction, similar to the acoustic wave device 1.

Figure 20A:
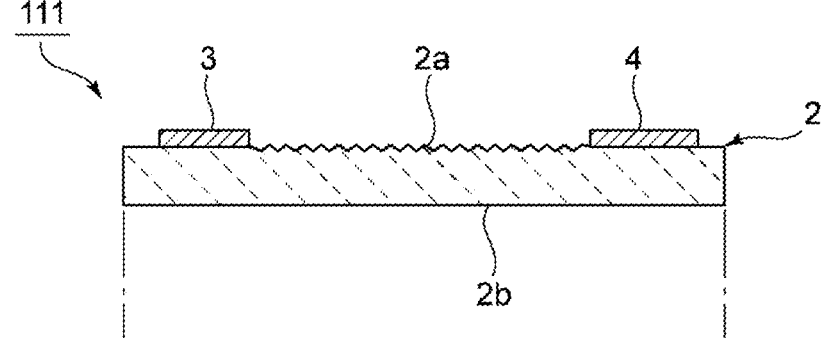
FIG. 20A is an elevational sectional view of an acoustic wave device according to an eleventh preferred embodiment of the present invention.
Figure 20B:
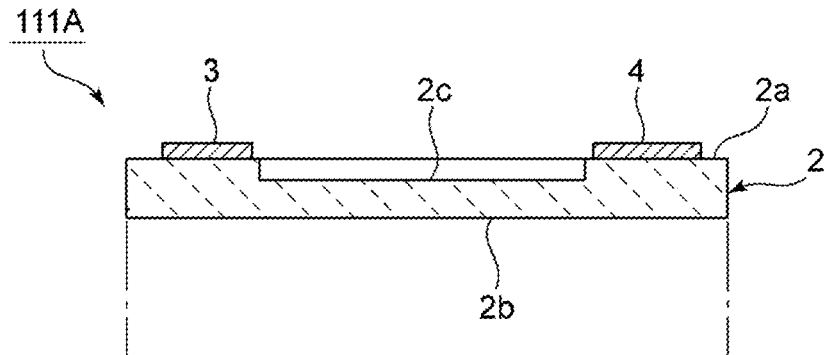
FIG. 20B is an elevational sectional view of a modification thereof.

FIG. 20A is an elevational sectional view of an acoustic wave device according to an eleventh preferred embodiment of the present invention, and FIG. 20B is an elevational sectional view illustrating a modification thereof. Similar to FIG. 19A, FIGS. 20A and 20B also show only a portion where the piezoelectric layer 2 and at least one pair of the electrodes 3 and 4 of an acoustic wave device 111 are disposed. The acoustic wave device 111 includes a surface having irregularity as the first main surface 2a of the piezoelectric layer 2. In this case, adjustment of the degree of irregularity of the surface allows adjustment of the frequency. The acoustic wave device 111 is similar to the acoustic wave device 1 according to the first preferred embodiment, in regard to other configurations.

Meanwhile, in an acoustic wave device 111A in the modification of the eleventh preferred embodiment shown in FIG. 20B, a gap between the electrode 3 and the electrode 4 is shaved to provide a recess 2c. Adjustment of the size or depth of the recess 2c also allows adjustment of frequency.

Figure 21:
FIG. 21 is an elevational sectional view of an acoustic wave device according to a twelfth preferred embodiment of the present invention.
Figure 21:
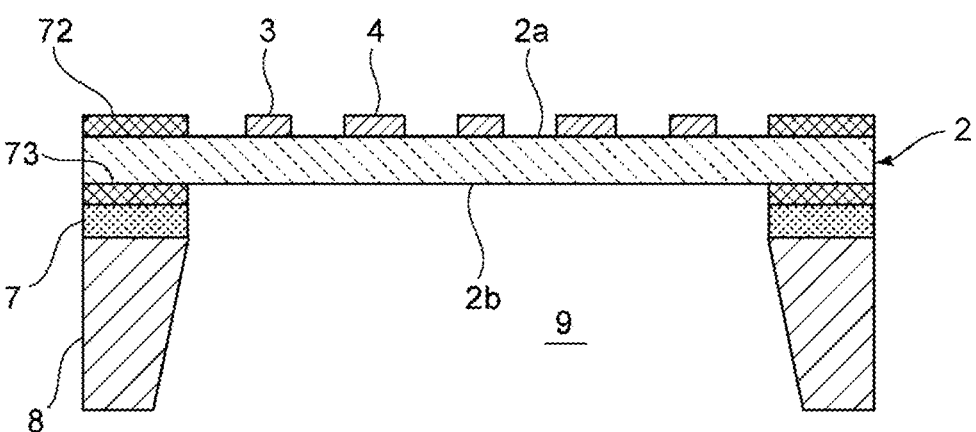

FIG. 21 is an elevational sectional view of an acoustic wave device according to a twelfth preferred embodiment of the present invention. In an acoustic wave device 121, a mass addition film 72 is provided on the first main surface 2a of the piezoelectric layer 2. Moreover, a mass addition film 73 is also provided on the second main surface 2b. The mass addition films 72 and 73 are disposed outside of an excitation region, that is, outside of a region where the plurality of electrodes 3 and 4 is provided. In FIG. 21, the mass addition films 72 and 73 are disposed at a position overlapping with the insulation layer 7, although the mass addition film 72 or the mass addition film 73 can be disposed at any position outside of the excitation region.

Only one of the mass addition films 72 and 73 may be provided. In addition, a material for the mass addition films 72 and 73 may be, for example, an insulator such as silicon oxide, silicon oxynitride, or alumina, metal such as Al, or alloy.

Figure 22:
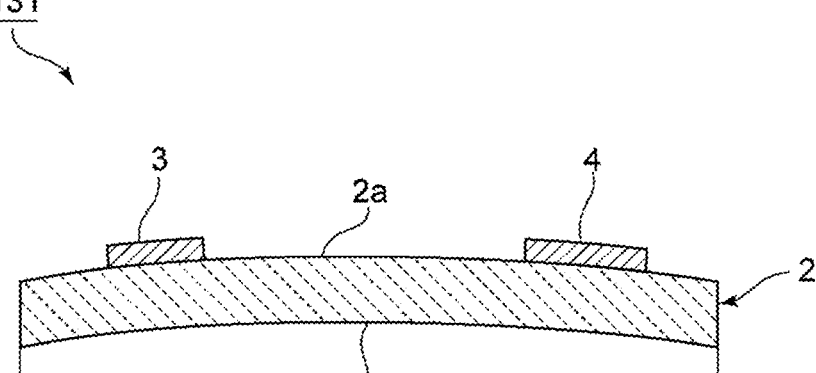
FIG. 22 is an elevational sectional view of a piezoelectric layer and a pair of electrodes in a thirteenth preferred embodiment of the present invention.

FIG. 22 is an elevational sectional view of a piezoelectric layer and a pair of electrodes of an acoustic wave device according to a thirteenth preferred embodiment of the present invention. In an acoustic wave device 131, the first main surface 2a and the second main surface 2b of the piezoelectric layer 2 have a curved surface shape. In this way, the piezoelectric layer 2 need not be a flat piezoelectric film, and may be curved at least in a portion thereof.

Figures 23A, 23B, 23C, 23D:
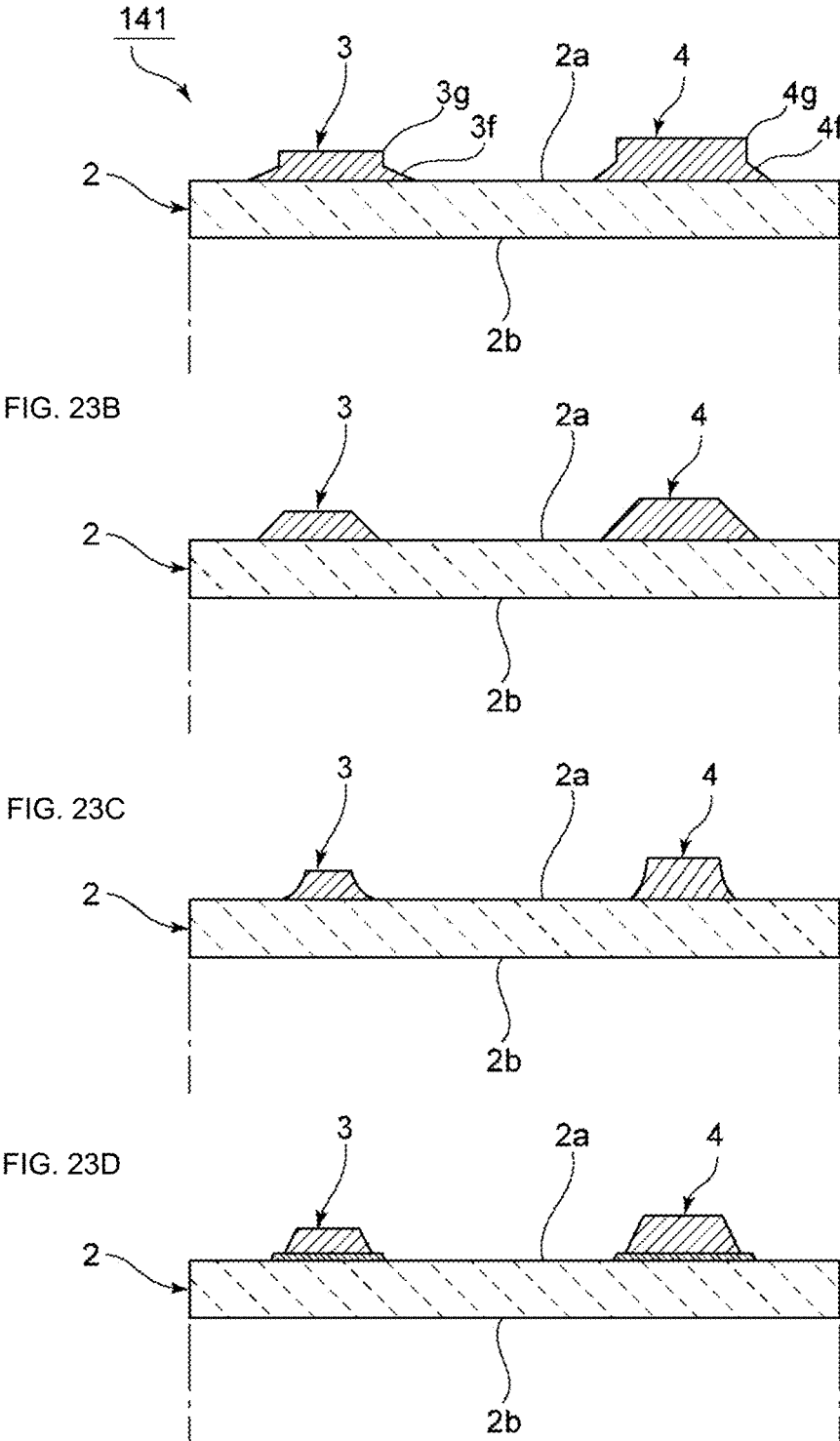
FIG. 23A is an elevational sectional view of a piezoelectric layer and a pair of electrodes in a fourteenth preferred embodiment of the present invention.
FIGS. 23B to 23D are elevational sectional views of modifications thereof.

FIG. 23A is an elevational sectional view of a piezoelectric layer and a pair of electrodes of an acoustic wave device according to a fourteenth preferred embodiment of the present invention. In an acoustic wave device 141, sectional shapes of at least one pair of the electrodes 3 and 4 have modified shapes different from a rectangle or an approximate rectangle. In other words, each of the electrodes 3 and 4 includes the wider portion 3f or 4f located on the first main surface 2a, and the rectangular or substantially rectangular sectional portion 3g or 4g provided on the wider portion 3f or 4f. In regard to the side surface of the wider portions 3f and 4f, the wider portions 3f and 4f are tapered so as to become thinner from the first main surface 2a side toward the rectangular or substantially rectangular sectional portion 3g and 4g sides. The arrangement of the wider portions 3f and 4f allows reducing a distance between the electrode 3 and the electrode 4. This allows increase in capacitance between the electrodes. Consequently, it is possible to increase capacitance without significantly changing resonance characteristics.

In this way, sectional shapes of at least one pair of the electrodes 3 and 4 may be shapes different from a rectangle or an approximate rectangle, that is, a modified shape. Moreover, a part of the electrode 3 or 4 may have a portion extending toward the companion electrode 4 or 3.

Moreover, the electrodes 3 and 4 may have a shape as shown in, for example, any of FIGS. 23B to 23D. The electrodes 3 and 4 shown in FIG. 23B have a sectional trapezoid or substantially trapezoid shape. Furthermore, the electrodes 3 and 4 shown in FIG. 23C have a shape broaden toward the bottom, and include a curved surface on both side surfaces in the width direction. In addition, the electrodes 3 and 4 shown in FIG. 23D have a sectional trapezoid or approximate trapezoid shape on the upper end side and a sectional trapezoid shape wider than the upper sectional trapezoid shape on the lower end side.

Figure 24A:
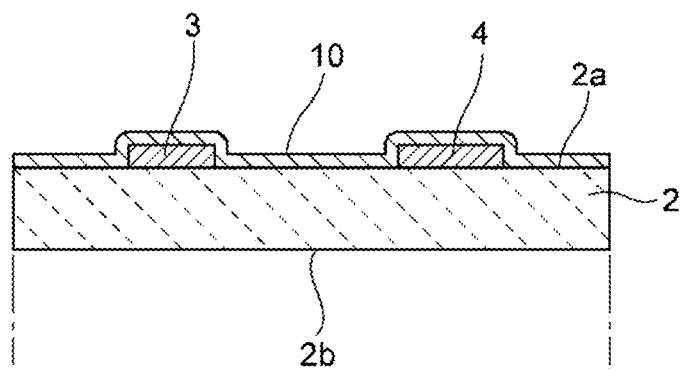
FIG. 24A to 24C are elevational sectional views of further modifications of an acoustic wave device according to a preferred embodiment of the present invention.
Figure 24B:
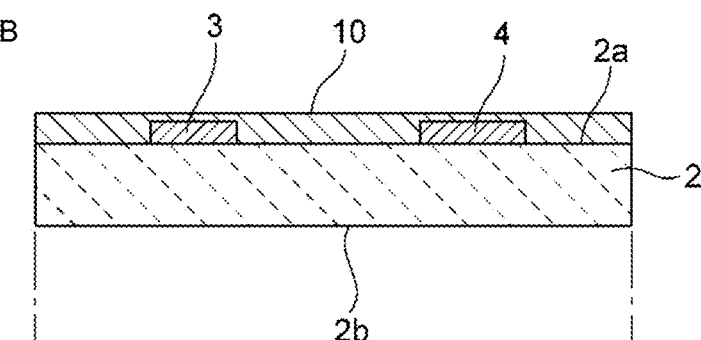
Figure 24C:
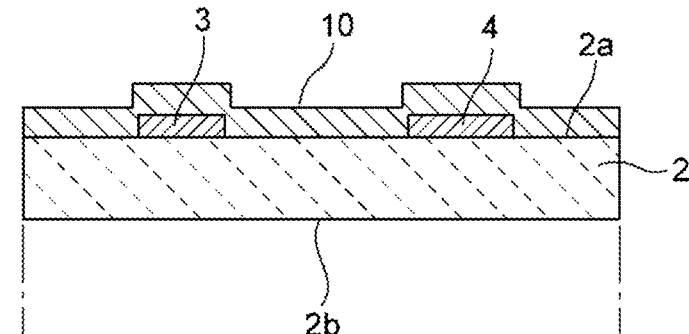

Furthermore, the acoustic wave device 1 may include a dielectric film 10 covering the first main surface 2a of the piezoelectric layer 2 and the electrodes 3 and 4 on the first main surface 2a, as shown in any of FIGS. 24A to 24C. In FIG. 24A, the thickness of the dielectric film 10 is thinner than the thickness of the electrodes 3 and 4, and the surface of the dielectric film 10 has an irregular shape along the shape of the underlying portion. In FIG. 24B, the surface of the dielectric film 10 is flattened, and has a plane or substantially plane shape. In FIG. 24C, the thickness of the dielectric film 10 is thicker than the thickness of the electrodes 3 and 4, and the surface of the dielectric film 10 has an irregular shape along the shape of the underlying portion.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric layer made of lithium niobate or lithium tantalate; and
   at least one pair of electrodes opposed to each other in a direction intersecting a thickness direction of the piezoelectric layer; wherein
   bulk waves in a thickness shear primary mode are used;
   the at least one pair of electrodes extends a longitudinal direction;
   the at least one pair of electrodes includes a first electrode and a second electrode having sectional shapes different from each other in any cross section in a direction orthogonal or substantially orthogonal to the longitudinal direction of the at least one pair of electrodes; and
   an inclination angle of at least a portion of an electrode side surface of the first electrode relative to the piezoelectric layer is different from an inclination angle of at least a portion of an electrode side surface of the second electrode in any cross section in the direction orthogonal or substantially orthogonal to the longitudinal direction of the at least one pair of electrodes.

2. An acoustic wave device comprising:
   a piezoelectric layer made of lithium niobate or lithium tantalate; and
   at least one pair of electrodes opposed to each other in a direction intersecting a thickness direction of the piezoelectric layer; wherein
   d/p is about 0.5 or less, where d is a thickness of the piezoelectric layer and p is a distance between centers of electrodes adjacent to each other in the at least one pair of electrodes;
   the at least one pair of electrodes extends in a longitudinal direction;

the at least one pair of electrodes includes a first electrode and a second electrode having sectional shapes different from each other in any cross section in a direction orthogonal or substantially orthogonal to the longitudinal direction of the at least one pair of electrodes; and an inclination angle of at least a portion of an electrode side surface of the first electrode relative to the piezoelectric layer is different from an inclination angle of at least a portion of an electrode side surface of the second electrode in any cross section in the direction orthogonal or substantially orthogonal to the longitudinal direction of the at least one pair of electrodes.

3. The acoustic wave device according to claim 2, wherein the d/p is about 0.24 or less.

4. The acoustic wave device according to claim 1, wherein a thickness of the first electrode is different from a thickness of the second electrode in any cross section in the direction orthogonal or substantially orthogonal to the longitudinal direction of the at least one pair of electrodes.

5. The acoustic wave device according to claim 1, wherein a width of the first electrode is different from a width of the second electrode.

6. The acoustic wave device according to claim 1, wherein a metallization ratio MR satisfies MR≤1.75 (d/p)+0.075, the metallization ratio MR being a ratio of an area of the at least one pair of electrodes in an excitation region relative to the excitation region, the excitation region being a region where the at least one pair of electrodes overlaps each other as viewed in a direction where the at least one pair of electrodes are opposed to each other.

7. The acoustic wave device according to claim 1, further comprising:

a first busbar and a second busbar connected to the at least one pair of electrodes; wherein the at least one pair of electrodes includes an electrode connected to the first busbar and an electrode connected to the second busbar.

8. The acoustic wave device according to claim 1, wherein Euler angles (Φ, θ, ψ) of the lithium niobate or lithium tantalate is in a range of Expression (1), Expression (2), or Expression (3) below:

$$(0°±10°, 0° \text{ to } 20°, \text{any } ψ) \qquad \text{Expression (1);}$$

$$(0°±10°, 20° \text{ to } 80°, 0° \text{ to } 60°(1-(θ-50)^2/900)^{1/2})$$
$$\text{or } (0°±10°, 20° \text{ to } 80°, [180°-60°(1-(θ-50)^2/900)^{1/2}] \text{ to } 180°) \qquad \text{Expression (2); or}$$

$$(0°±10°, [180°-30°(1-(ψ-90)^2/8100)^{1/2}] \text{ to } 180°, \text{any } ψ) \qquad \text{Expression (3).}$$

9. The acoustic wave device according to claim 1, wherein Euler angles (φ, θ, ψ) of the lithium niobate or lithium tantalate is within a hatched region in FIG. 10.

10. The acoustic wave device according to claim 1, further comprising a support on an opposite side from a side of the piezoelectric layer on which the at least one pair of electrodes are provided.

11. The acoustic wave device according to claim 10, further comprising an air gap on an opposite side from a side of the piezoelectric layer on which the at least one pair of electrodes are provided, in a region overlapping in plan view with at least a portion of a region including the at least one pair of electrodes.

12. The acoustic wave device according to claim 1, further comprising:

an acoustic multilayer film laminated on an opposite side from a side of the piezoelectric layer on which the at least one pair of electrodes are provided; wherein the acoustic multilayer film has a layered structure including a low-acoustic impedance layer having relatively low acoustic impedance, and a high-acoustic impedance layer having relatively high acoustic impedance.

13. The acoustic wave device according to claim 1, wherein the at least one pair of electrodes are opposed to each other on a same plane of the piezoelectric layer.

14. The acoustic wave device according to claim 2, wherein a thickness of the first electrode is different from a thickness of the second electrode in any cross section in the direction orthogonal or substantially orthogonal to the longitudinal direction of the at least one pair of electrodes.

15. The acoustic wave device according to claim 2, wherein a width of the first electrode is different from a width of the second electrode.

16. The acoustic wave device according to claim 2, wherein a metallization ratio MR satisfies MR≤1.75 (d/p)+0.075, the metallization ratio MR being a ratio of an area of the at least one pair of electrodes in an excitation region relative to the excitation region, the excitation region being a region where the at least one pair of electrodes overlaps each other as viewed in a direction where the at least one pair of electrodes are opposed to each other.

17. The acoustic wave device according to claim 2, further comprising:

a first busbar and a second busbar connected to the at least one pair of electrodes; wherein the at least one pair of electrodes includes an electrode connected to the first busbar and an electrode connected to the second busbar.

18. The acoustic wave device according to claim 2, wherein

Euler angles (φ, θ, ψ) of the lithium niobate or lithium tantalate is in a range of Expression (1), Expression (2), or Expression (3) below:

$$(0°±10°, 0° \text{ to } 20°, \text{any } ψ) \qquad \text{Expression (1);}$$

$$(0°±10°, 20° \text{ to } 80°, 0° \text{ to } 60°(1-(θ-50)^2/900)^{1/2})$$
$$\text{or } (0°±10°, 20° \text{ to } 80°, [180°-60°(1-(θ-50)^2/900)^{1/2}] \text{ to } 180°) \qquad \text{Expression (2); or}$$

$$(0°±10°, [180°-30°(1-(ψ-90)^2/8100)^{1/2}] \text{ to } 180°, \text{any } ψ) \qquad \text{Expression (3).}$$

\* \* \* \* \*